(12) United States Patent
Berland et al.

(10) Patent No.: US 7,872,464 B2
(45) Date of Patent: Jan. 18, 2011

(54) HAND HELD ARC FAULT TESTING SYSTEM

(75) Inventors: Kerry Berland, Chicago, IL (US); Mitchell Budniak, Highland Park, IL (US); Paul Berland, Chicago, IL (US); Ronald Coia, North Riverside, IL (US); Thomas McGann, Joliet, IL (US)

(73) Assignee: Unique Technologies, LLC, Joliet, IL (US)

( * ) Notice: Subject to any disclaimer, the term of this patent is extended or adjusted under 35 U.S.C. 154(b) by 0 days.

(21) Appl. No.: 12/345,266

(22) Filed: Dec. 29, 2008

(65) Prior Publication Data
US 2009/0160425 A1 Jun. 25, 2009

Related U.S. Application Data

(63) Continuation of application No. 10/821,551, filed on Apr. 8, 2004, now Pat. No. 7,471,075, which is a continuation-in-part of application No. 09/748,068, filed on Dec. 22, 2000, now Pat. No. 6,844,712, which is a continuation-in-part of application No. 09/061,434, filed on Apr. 17, 1998, now Pat. No. 6,166,532, and a continuation-in-part of application No. 09/830,240, filed on Apr. 24, 2001, now abandoned.

(60) Provisional application No. 60/461,236, filed on Apr. 8, 2003.

(51) Int. Cl.
*G01R 19/00* (2006.01)
*G01R 31/00* (2006.01)

(52) U.S. Cl. ..................... 324/67; 324/133; 324/508; 324/542

(58) Field of Classification Search ................ None
See application file for complete search history.

(56) References Cited

U.S. PATENT DOCUMENTS

| 6,421,214 B1* | 7/2002 | Packard et al. ............... 361/7 |
| 2002/0063565 A1* | 5/2002 | Stroth ........................ 324/536 |
| 2003/0169051 A1* | 9/2003 | Tallman et al. ............. 324/523 |

* cited by examiner

*Primary Examiner*—Jay M Patidar
(74) *Attorney, Agent, or Firm*—Eugene M. Cummings, P.C.

(57) ABSTRACT

A testing system includes a hand-held transmitter that plugs into a receptacle electrically coupled to a selected branch circuit. The transmitter includes a circuit effective to test an arc fault circuit interrupter electrically coupled to the branch circuit by creating a first pulse on the branch circuit that is effective to trip the arc fault circuit interrupter. The transmitter can perform at least one additional test including: determining whether the receptacle is wired properly; determining a location of a circuit interrupting device electrically coupled to the branch circuit by creating a second pulse on the branch circuit that can be sensed by a receiver located proximately to the respective circuit interrupting device and broadly tuned about a frequency of the second pulse; and testing a ground fault circuit interrupter electrically coupled to the branch circuit by creating a third pulse on the branch circuit that is effective to trip the ground fault circuit interrupter.

3 Claims, 14 Drawing Sheets

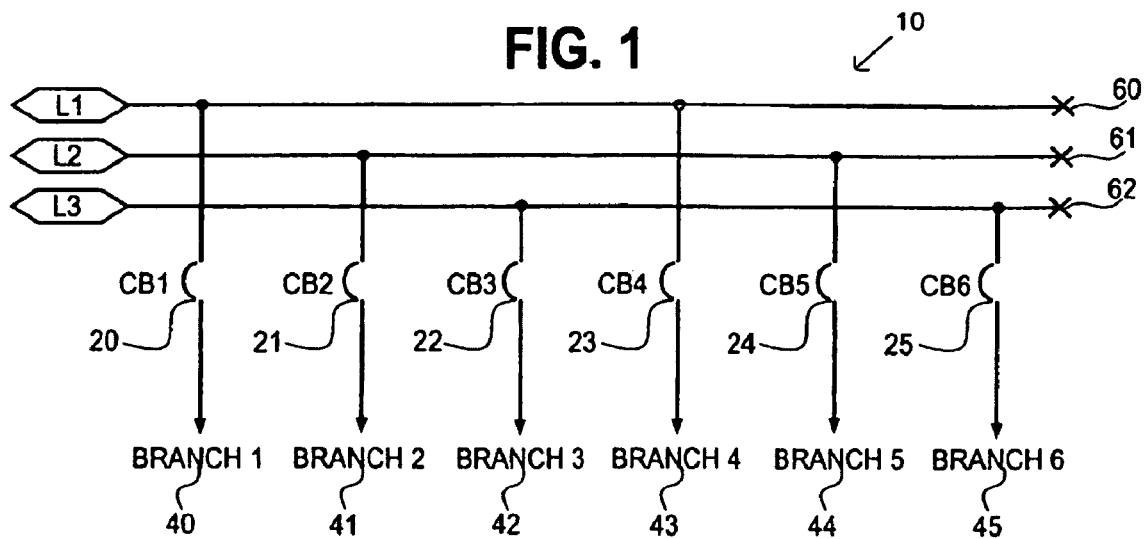
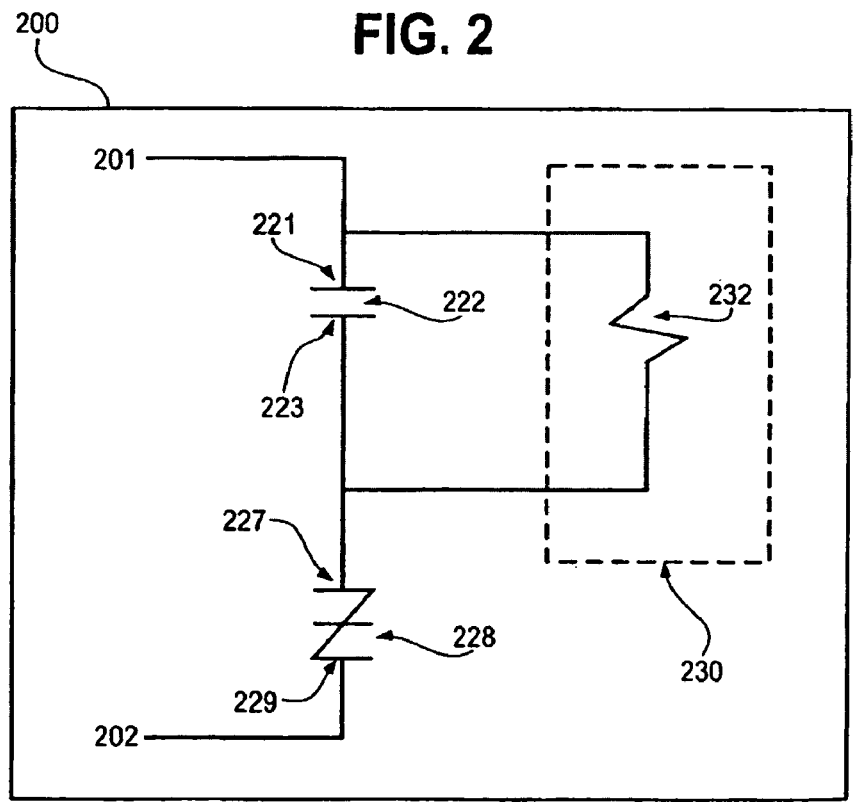

HAND HELD ARC FAULT TESTING SYSTEM

STATEMENT OF RELATED APPLICATIONS

This application is a continuation of U.S. application Ser. No. 10/821,551 filed on Apr. 8, 2004, which is a continuation in part of U.S. application Ser. No. 09/748,068 filed Dec. 22, 2000, now U.S. Pat. No. 6,844,712, which is a continuation in part of application Ser. No. 09/061,434 filed Apr. 17, 1998, now U.S. Pat. No. 6,166,532, and U.S. Ser. No. 09/830,240 filed on Apr. 24, 2001 which was filed through the Patent Cooperation Treaty under Serial No. PCT/US99/25775 on Nov. 3, 1998. This application is also based on U.S. Provisional Application Ser. No. 60/461,236 filed Apr. 8, 2003. This application claims the benefit of the filing dates of the above-identified applications, all of which are incorporated herein by reference to the extent permitted by law.

FIELD OF THE INVENTION

The present invention relates in general to devices for testing electrical components and, in particular, to a system for distinguishing the circuit-interrupting device (circuit breaker or fuse) associated with a particular electrical line from a plurality of circuit interrupting devices and for testing arc fault and ground fault circuit interrupters.

BACKGROUND ART

When electrical work needs to be performed on an electrical system in a building or facility, it is typically necessary to trace and identify which circuit interrupter device (i.e., circuit breaker or fuse) is supplying power to a specific AC power branch circuit.

Manual identification of the fuse or circuit breaker can be accomplished by removing each fuse or opening each circuit breaker, thereby disrupting the power flow through the circuit. Each test point must subsequently be examined to determine whether the power to the test point has been disconnected. This method is not only time consuming, but also may not be feasible in situations where it would be hazardous to interrupt the power flow to certain branch circuit outlets, i.e., in a hospital or in environments where there are computers in use without backup power.

Accordingly, there is a need to provide a circuit tester that provides an identification signal that is easily detectable by an adequately sensitive receiver, and is simple to implement and inexpensive to produce.

Accordingly, there is also a need for a circuit tester that provides more reliable identification of a selected circuit branch while making it easier and less time consuming for the user to operate by eliminating the need for manual calibration and the associated potential for user error.

In addition to the need to locate circuit interrupters, there is also a desire to test circuit interrupters. Effective Jan. 1, 2002, the National Electrical code has required that arc fault circuit interrupters (AFCIs) must be installed on electrical circuits that provide household power to bedrooms in new residential construction. This requirement resulted in part from studies conducted under the sponsorship of the U.S. Consumer Product Safety Commission. Electrical and fire safety experts concluded that many household fires are not prevented by conventional circuit interrupters, which detect sustained circuit overloads exceeding the nominal current rating of the circuit interrupter (e.g., 20 amperes) for several seconds or more. A significant number of fires are caused not by sustained short circuits, but by arc faults. An arc fault is characterized, for purposes of this disclosure, by an intermittent arc or sputtering current drawn between hot and neutral electrical leads or between exposed portions of a wire having worn insulation. Arc faults are caused by a variety of circumstances. Although the arc fault may not draw enough continuous current to trip a conventional electromagnetic circuit interrupter, it can still cause-enough localized heat to ignite surrounding flammable substances and cause a fire.

Underwriters Laboratories has published UL Standard 1699, which establishes standards for AFCIs, which are circuit interrupters that can detect arc faults. The UL standard includes test procedures for use by UL and AFCI manufacturers for to test an AFCI. In accordance with the standards, a UL-recognized AFCI is required to provide a test button that a user can press to test the AFCI. When the user actuates the test button, circuitry within the AFCI injects a test signal into the AFCI's arc fault detection circuitry. If the AFCI is operating properly, the AFCI should detect the test signal and the circuit interrupter should trip.

Thus, a user can actuate the test button, which is built into an AFCI, to test the AFCI's functionality. However, to conduct such a test the user must go to the circuit breaker panel, which is often in an inconvenient location. For example, the circuit breaker panel may be in the basement of a house, while the protected circuits are in an upper-story bedroom. Further, without additional equipment, it is typically not easy to determine that a given receptacle in a bedroom is actually connected to the circuit that is protected by the AFCI. Electrical inspectors, electricians, and other users who check AFCIs and their associated circuits could benefit from a device that plugs into an electrical receptacle (e.g., in a bedroom) and quickly identifies whether that circuit is protected by a properly functioning AFCI. It would be further beneficial if the AFCI tester device would be implemented together with a circuit interrupter locator within a same device.

These and other useful aspects of the invention will be apparent to those of ordinary skill in the art having the present drawings, specification and claims before them.

SUMMARY OF THE INVENTION

Some of the foregoing needs are met and problems solved by a multi-function testing system. In accordance with systems consistent with the present invention, a testing system is provided that includes a hand-held transmitter that plugs into a receptacle electrically coupled to a selected branch circuit. The transmitter has a circuit effective to test an arc fault circuit interrupter electrically coupled to the selected branch circuit by creating a pulse on the branch circuit that is effective to trip the arc fault circuit interrupter. The transmitter can perform a test of determining whether the receptacle is wired properly.

In accordance with systems consistent with the present invention, a testing system is provided that includes a hand-held transmitter that plugs into a receptacle electrically coupled to a selected branch circuit. The transmitter has a circuit effective to test an arc fault circuit interrupter electrically coupled to the selected branch circuit by creating a first pulse on the branch circuit that is effective to trip the arc fault circuit interrupter. The transmitter can perform a test of determining a location of a circuit interrupting device electrically coupled to the selected branch circuit by creating a second pulse on the branch circuit that can be sensed by a receiver located proximately to the respective circuit interrupting device and broadly tuned about a frequency of the second pulse.

In accordance with systems consistent with the present invention, a testing system is provided that includes a handheld transmitter that plugs into a receptacle electrically coupled to a selected branch circuit. The transmitter has a circuit effective to test an arc fault circuit interrupter electrically coupled to the selected branch circuit by creating a first pulse on the branch circuit that is effective to trip the arc fault circuit interrupter. The transmitter can test a ground fault circuit interrupter electrically coupled to the selected branch circuit by creating a second pulse on the selected branch circuit that is effective to trip the ground fault circuit interrupter.

In accordance with systems consistent with the present invention, an arc fault circuit interrupter tester is provided. The arc fault circuit interrupter includes a processor having an internally calculated clock rate. The processor generates a timing period signal for generating simulated arc fault pulses by calibrating the internally calculated clock rate based on a received synchronization signal. A switching circuit outputs the simulated arc fault pulses at a timing period defined by the timing period signal.

In accordance with methods consistent with the present invention, a method for testing an arc fault circuit interrupter is provided. The method comprises: generating a timing period signal for generating simulated arc fault pulses by calibrating an internally calculated clock rate of a processor based on a received synchronization signal; and outputting the simulated arc fault pulses at a timing period defined by the timing period signal output by the processor.

In accordance with systems consistent with the present invention, an arc fault circuit interrupter is provided. The arc fault circuit interrupter comprises: means for generating a timing period signal for generating simulated arc fault pulses by calibrating an internally calculated clock rate of a processor based on a received synchronization signal; and means for outputting the simulated arc fault pulses at a timing period defined by the timing period signal output by the processor.

BRIEF DESCRIPTION OF THE DRAWING

FIG. 1 is a wiring diagram illustrating a potential AC power distribution panel providing power to a plurality of branch circuits through their respective circuit interrupting devices;

FIG. 2 is a schematic diagram illustrating the various components in one potential embodiment of the transmitter of the present invention;

BEST MODE OF CARRYING OUT THE PRESENT INVENTION

Figure 3:
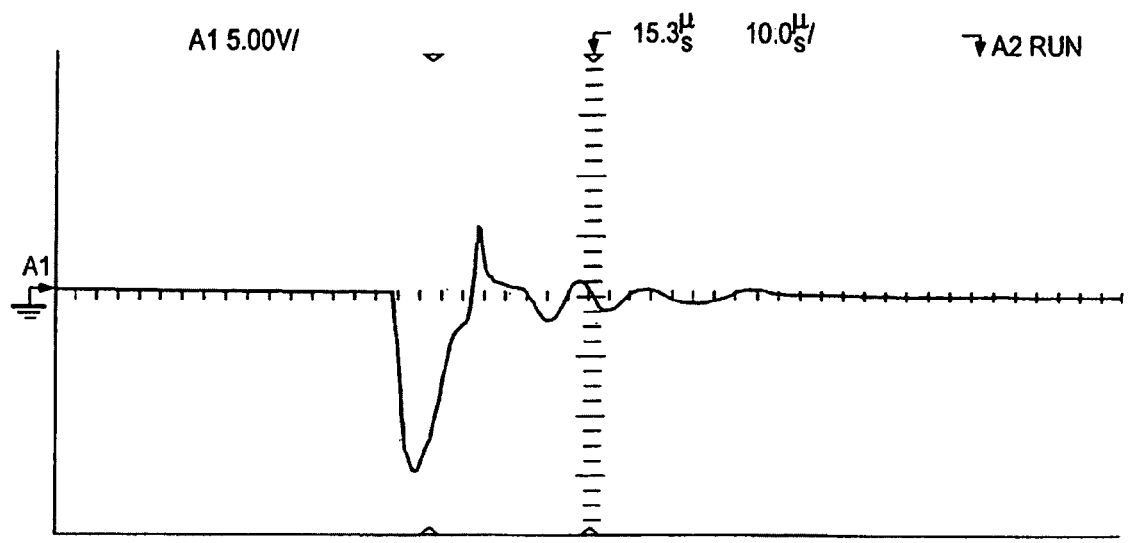
FIG. 3 is an illustrative plot of a current spike signal produced by the transmitter of FIG. 2 across a 1 ohm non-inductive resistor in an earth ground circuit.

While the present invention may be embodied in many different forms, there are shown in the drawings and discussed herein several potential embodiments with the understanding that the present disclosure is to be considered only as an exemplification of the principles of the invention and is not intended to limit the invention to the embodiments illustrated.

The present system as disclosed herein can perform a number of tests. Specifically, the system locates the circuit interrupter associated with a particular branch circuit from amongst a plurality of circuit interrupting devices, checks receptacle wiring, and tests the circuit interrupter. FIG. 1 schematically depicts a potential AC power distribution panel 10 having three power line bus bars 60, 61 and 62 and a plurality of circuit interrupting devices (CB1, CB2, CB3, CB4, CB5 and CB6) each connected in series between a respective bus bar and a respective branch circuit (40, 41, 42, 43, 44, and 45, respectively). Although AC power distribution panel 10 is depicted as using circuit breakers, it would be understood by one of ordinary skill in the art that the present system would operate in the manner disclosed herein to locate and test any type of circuit interrupter device including, but not limited to arc fault circuit interrupters, circuit breakers and fuses. As is known in the art, each circuit interrupter device provides overload protection to its associated branch circuit. While AC power distribution panel 10 reflects a balancing of power distribution loads (i.e. each power line bus bar distributes power to an equal number of branch circuits), it should be understood that power does not have to be evenly distributed for the present system to operate in the manner disclosed herein.

Branch circuits 40, 41, 42, 43, 44, and 45 as shown in AC power distribution panel 10 are hot leads. Each branch circuit also includes a neutral lead (not shown in FIG. 1) that together with the branch circuit's hot lead supplies AC power to loads operably connected to the respective branch circuit. The branch circuit may also include a ground lead in order to provide ground fault protection.

The present system for locating and testing a circuit interrupter associated with a particular branch circuit is comprised of two separate devices, a receiver and a transmitter. The transmitter generates an identification signal that is coupled to the power line, and may additionally have the functionality of a receptacle analyzer, a ground fault circuit interrupter (GFCI) tester, and AFCI tester. The receiver detects the identification signal generated by the transmitter in order to identify a particular branch circuit. The receiver may also have the additional functionality of sensing live AC wiring.

The transmitter described herein will operate in multiple wiring situations, so long as the hot conductor is available on one of the branch circuit terminals, and either neutral or ground is connected to one of the remaining terminals.

FIG. 2 of the drawings depicts a potential embodiment of the transmitter that can be used within the present system. Transmitter 200 has a first lead 201 and a second lead 202 for operably connecting to a particular branch circuit. This connection may be accomplished by mating the transmitter to a selected branch circuit via a standard power outlet (not shown) or by other standard means such as probes, alligator clips, and other elements well known in the art. To illustrate operation of the present system, it is assumed that user has already connected transmitter 200 to branch circuit 40 in order to locate the circuit interrupter associated with that selected branch circuit. The transmitter will function as described below as long as power (from hot lead in branch circuit) is supplied to either first lead 201 or second lead 202 and either neutral or ground is connected to the other lead.

transmitter 200 further includes a charge storage device 222 and a voltage controlled switch 228 connected in series. In the preferred embodiment of the invention, a first terminal 221 of charge storage device 222 is operably connected to first lead 201, and a second terminal 223 of charge storage device 222 is operably connected in series with a first terminal 227 of voltage controlled switch 228. A second terminal 229 of voltage controlled switch 228 is then operably connected to second lead 202. However, the order of charge storage device 222 and voltage controlled switch 228 may be changed without altering the functionality of the firing circuit.

As long as power is supplied to either first lead 201 or second lead 202, transmitter 200 will create a current spike when connected to the branch circuit. On the positive half cycle of the AC wave, current through the circuit is initially blocked by the voltage controlled switch 228. Once the voltage across voltage controlled switch 228 reaches the breakover voltage of voltage controlled switch 228, the voltage controlled switch conducts current, thus allowing charge storage device 222 to charge. The voltage across charge storage device 222 quickly rises to the instantaneous level of the power line voltage imposed between leads 201 and 202, which has just reached the breakover voltage. The voltage quickly rises because the AC power line and voltage controlled switch 228 (in its "on" state) have a very low combined impedance. During the charging of the charge storage device 222, the current through charge storage device 222 is initially high. As the charge storage device charges, the current through voltage controlled switch 228 decreases. Once the current through voltage controlled switch 228 falls below a minimum holding current, voltage-controlled switch 228 reverts to a blocking stage and the current stops being conducted. As a result, a current spike of very-short duration is drawn through transmitter 200 and, thus through the particular branch circuit to which the transmitter is connected.

In one preferred embodiment of the invention, voltage controlled switch 228 is a SIDAC, having a breakover voltage, Vz, of 90V. It is contemplated that a SIDAC with a different breakover voltage may be used so long as Vz is no greater than the expected line voltage. Furthermore, the charge storage device is preferably a capacitor.

Discharge circuit 230 is connected in parallel with charge storage device 222. Once current is no longer being conducted through voltage controlled switch, the energy stored by charge storage device 222 is discharged through the discharge circuit 230. Because the leakage resistance of most devices that may be used as the charge storage device is too high to permit the charge storage device to discharge rapidly enough to generate a sufficient quantity of current spikes, discharge circuit 230 is utilized to remove the charge across charge storage device 222 so that subsequent current spikes may be generated.

In one preferred embodiment, the discharge circuit is comprised of a resistor 232. The resistor in parallel with the charge storage device forms an RC circuit. It is contemplated that resistor 232 is chosen such that the time constant for the RC circuit is about 10-12 ms. As a result, a single current spike is created during each single half cycle of a standard 60 Hz AC waveform. However, it is contemplated that resistor 232 may be chosen to create a different time constant in order to change the duration of time it takes charge storage device 222 to discharge. With a shorter time constant, the voltage drop across voltage controlled switch 228 may once again reach the breakover current during the same positive half cycle of a standard 60 Hz AC waveform. As a result, the voltage controlled switch 228 may once again begin to conduct current and a second current spike will be created during the same half cycle of the AC waveform. Thus, multiple current spikes may be generated during one half cycle of the AC waveform. By selecting values for the components, the above process repeats during the negative half of the AC wave. Thus, transmitter 200 may generate a current spike during each half cycle of the AC wave. Of course, with other waveforms (e.g. 50 Hz AC) similar results can be achieved by selecting the nominal values of the components appropriately.

The current spike signal in selected branch circuit 40 creates an electromagnetic field about branch circuit 40. Unavoidably, the electromagnetic field will generate a current spike on any branch circuits adjacent (i.e. within the created electromagnetic field) to the particularly selected branch circuit (i.e., branch circuit 40). However, the current spike signal produced by transmitter 200 is of significantly short duration that there is insufficient time for a full strength sympathetic signal to develop in the other, unselected but adjacent branch circuits. Consequently, the difference in signal strength between the current spike signal produced by transmitter 200 on the particularly selected branch circuit and any sympathetic signals developed on any adjacent branch circuits is of such magnitude that they can be distinguished from one another.

FIG. 3 of the drawings illustrates a negative-going current spike generated by the negative-going phase of the AC waveform. In this example, the current spike is generated by a transmitter 200 with resistor 232 having a value of 24 kiloohms and charge storage device 222 being a capacitor having a value of 0.39 microfarads. As shown, the resulting current spike signal has a magnitude on the order of 15 amps and a pulse width duration on the order of 10 microseconds. As would be known to one of ordinary skill in the art, additional loads and associated impedances on a particular branch circuit will likely change the resulting amplitude and duration of the current spike signal.

Figure 4:
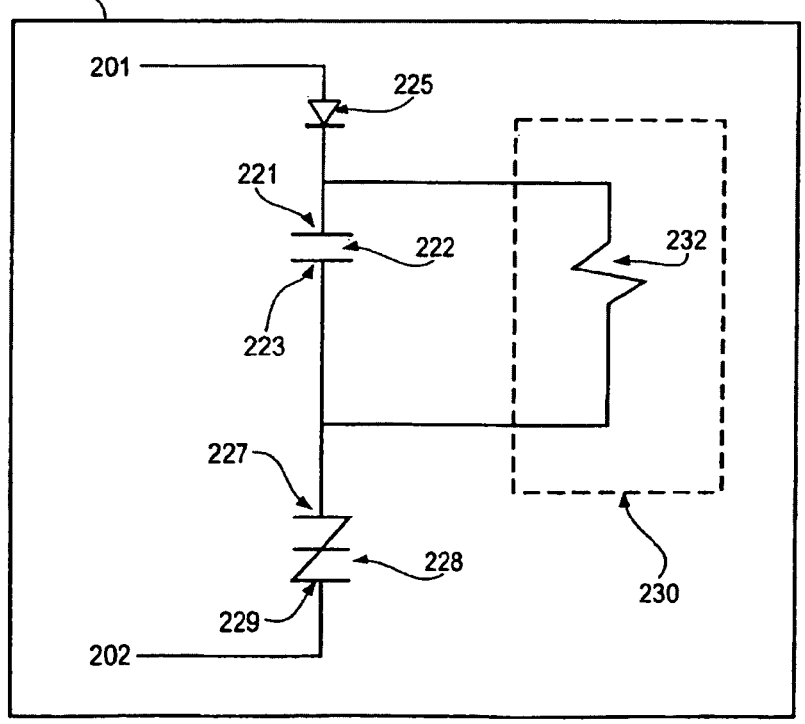
FIG. 4 is a schematic diagram illustrating the various components in a second potential embodiment of the transmitter of the present invention.

In another embodiment of the present invention shown in FIG. 4, transmitter 200 may further include a diode 225 in series with charge storage device 222 and voltage controlled switch 228. Diode 225 prevents current from being conducted in a predetermined direction through transmitter 200. As a result, the transmitter only generates a current spike during one half cycle of the AC wave. Whether the current spike is generated during the positive half cycle or during the negative half cycle of the AC wave is dependent upon the orientation of the diode as well as whether the hot lead from the branch circuit is connected to first lead 201 or second lead 202.

One approach to this embodiment utilizing a diode is shown in FIG. 4. The anode of the diode 225 is operably connected to the first lead and the cathode of the diode is connected to the first terminal 221 of the charge storage device. In this approach, when the first lead 201 is connected to the hot lead of the branch circuit, the transmitter will only generate a current spike during the positive half cycle of the AC wave. If the hot lead of the branch circuit is connected to the second lead 202, the transmitter will only generate a current spike during the negative half cycle of the AC wave.

Figure 5:
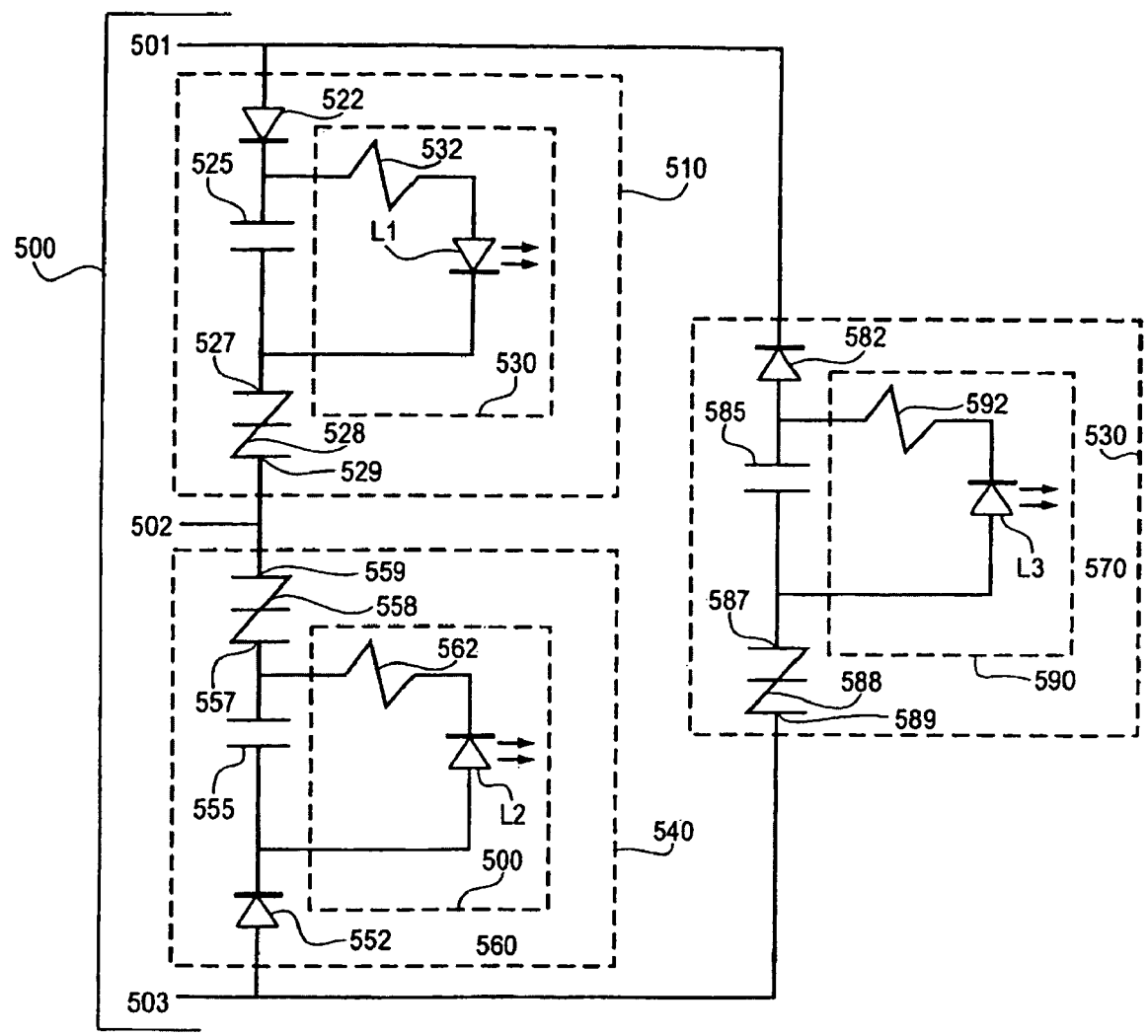
FIG. 5 is a schematic diagram illustrating the various components in a third potential embodiment of the transmitter of the present invention.

In another approach shown in FIG. 5, transmitter 500 has three subcircuits 510, 540, and 570. Each subcircuit 510, 540, and 570 includes a voltage controlled switch, a charge storage device, and a discharge circuit. Transmitter 500 further has a first lead 501, a second lead 502, and an optional third lead 503 for operably connecting to a particular branch circuit. Transmitter 500 will function regardless of which one of the leads 501, 502, or 503 are connected to the hot lead of a branch circuit and either neutral or ground is connected to at least one of the remaining leads. It is not necessary for all three leads to be connected to the branch circuit in order for the transmitter to function.

In this approach, first subcircuit 510 is connected between the first lead 501 and the second lead 502. First subcircuit 510 may include a diode 522, a charge storage device 525 and a voltage controlled switch 528 connected in series. Preferably, the anode of diode 522 is operably connected to first lead 501, and the cathode to charge storage device 525. The first terminal 527 of voltage controlled switch 528 is operably connected in series with charge storage device 525 and the second terminal 529 of voltage controlled switch 528 is connected to neutral lead 502. Discharge circuit 530 includes a resistor 532 that is in parallel with charge storage device 525.

The second subcircuit 540 is connected between third lead 503 and second lead 502. Like the first subcircuit, second subcircuit 540 may include a diode 552, a charge storage device 555, and a voltage controlled switch 558 in series. The anode of diode 552 is operably connected to third lead 503, and the cathode to charge storage device 555. A first terminal 557 of voltage controlled switch 558 is operably connected in series with charge storage device 555 and a second terminal 559 of voltage controlled switch 558 is connected to second lead 502. Discharge circuit 560 includes a resistor 562 that is in parallel to charge storage device 555.

In a similar fashion, the third subcircuit 570 is connected between first lead 501 and third lead 503. Third subcircuit 570 may also include a diode 582, a charge storage device 585, and a voltage controlled switch 588 in series. The anode of diode 582 is operably connected in series with charge storage device 585 and the cathode of diode 582 to first lead 501. The first terminal 589 of voltage controlled switch 588 is operably connected to third lead 503 and the second terminal 587 of voltage controlled switch 588 is connected in series with charge storage device 585. Discharge circuit 590 includes a resistor 592 that is in parallel to charge storage device 585.

Each subcircuit functions in the manner described above in order to generate a current spike. However, due to the orientation of the diodes 522, 552, and 582, the subcircuit(s) that actually generates the current spike is determined by the wiring scenario in a given situation. For example, in a properly wired circuit (meaning for purpose of this example the hot lead operably connected to first lead 501, neutral lead operably connected to second lead 502, and ground lead operably connected to third lead 503), the first subcircuit 510 will generate a current spike during the positive half cycle of the AC wave and the third subcircuit 590 will generate a current spike during the negative half wave cycle of the AC wave. As would be understood by those of skill in the art having the present application before them, other wiring scenarios will lead to other circuits being active.

Each discharge circuit may also include an optional light emitting diode ("LED") in series with the associated resistor. As shown in FIG. 5, LED L1 may be in series with resistor 532, LED L2 may be in series with resistor 562, and LED L3 may be in series with resistor 592. As the charge storage device discharges through its associated discharge circuit, the energy generated by this discharge circuit causes the associated LED to be illuminated. Thus, the LED will preferably be illuminated when the subcircuit associated with the LED generates a current spike. In this manner, the circuit will further function as a circuit fault indicator.

In a preferred design, LED L1 is a green light, LED L2 is a red light, and LED L3 is a yellow light to aid in user identification of wiring. The different illumination patterns of LED's L1, L2, and L3 created by various wiring scenarios are indicated in the following table:

|  | L1 | L2 | L3 |
|---|---|---|---|
| Properly Wired Circuit | ON | OFF | ON |
| Open ground | ON | OFF | OFF |
| Open neutral | OFF | OFF | ON |
| Reversed hot and neutral | ON | ON | OFF |
| Hot on neutral with open neutral | OFF | ON | OFF |
| Unenergized circuit | OFF | OFF | OFF |

Thus, the illumination pattern created by the light emitting diodes. L1, L2, and L3 will serve to identify the wiring scenario in the current circuit.

It would be known to one of ordinary skill in art that the present system as disclosed herein would operate in the same manner with 60 Hz AC power as is common in the United States and with 50 Hz AC power line as is commonly found in countries foreign to the United States.

Figure 6A:
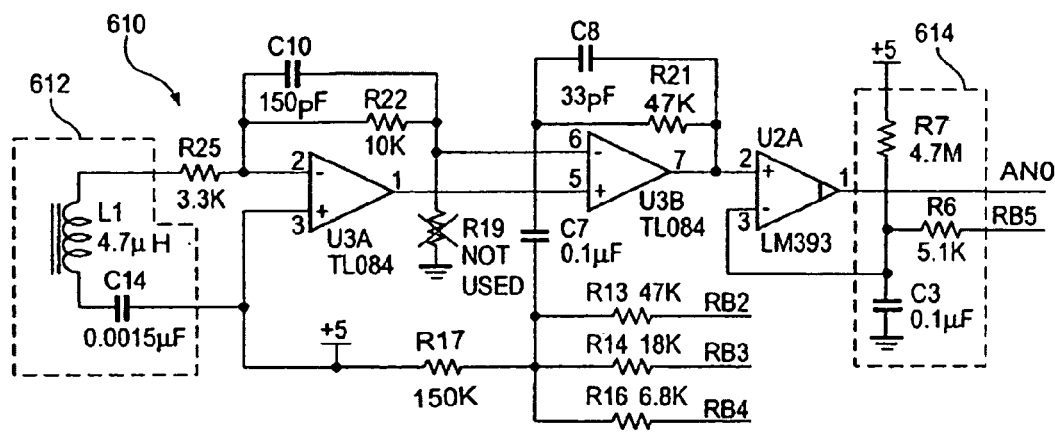
FIGS. 6A, B, C and D are schematic diagrams collectively illustrating the various components in a preferred embodiment of the receiver of the present invention.

FIGS. 6A, B, C and D of the drawings collectively depict an approach to the present system's receiver unit. Receiver 600 is broadly tuned about the predetermined frequency of the current spike signal that is created by the transmitter on a particular branch circuit 40. Receiver 600 drives a user-perceivable signaling device that is activated when receiver senses a signal with the predetermined frequency.

The receiver 600 is preferably a hand-held system. It may be designed to be used as a stand alone device (without using the transmitter) in voltage sensor mode, for the purpose of detecting a low frequency magnetic field as it is formed around energized power line conductors. When the receiver is utilized to scan the energized wiring system, the unit may be used as either a locator for the circuit interrupting device (circuit breaker or fuse) which protects the particular branch circuit where the transmitter is connected, or the receiver 600 can be used to trace energized power line wires which are hidden behind solid objects such as walls, conduits or other obstructions. Two further features may include an automatic power-off function and a low battery indicator.

Receiver 600 includes an HF pulse detector circuit 610, a field detector circuit 630, a user-perceivable signaling device 650, a microcontroller 670, and a power supply circuit 690.

In order to receive the current spike signals generated by the associated transmitter unit, inductor L1 is connected in series with capacitor C14, which make up a series-resonant tuned circuit 612 with a resonant frequency defined according to the following formula:

$$f=1/(2*PI*(LC)^{0.5})$$

Inductor L1 may be mounted towards the nose of receiver 600 such that the nose can be pointed by a user towards a circuit breaker panel to physically determine the branch to which circuit transmitter 200 is connected to. The nominal values of L1 and C14 lead to a resonant frequency of about 60 kHz.

Yet, because circuit 612 is broadly tuned it merely helps to reject other signals having frequencies far from the resonant frequency that may be present on the power lines being tested. Resistor R25 provides damping for the tuned circuit 612. Without damping resistor R25, the tuned circuit 612 might oscillate for a few cycles at its resonant frequency when exposed to a noise impulse on the power lines, possibly-causing receiver 600 to detect a false transmitter signal when in fact no transmitter signal is present.

HF pulse detector circuit 610 includes an operational amplifier U3A. The positive terminal of the op amp connects to voltage reference VR (preferably 5 volts) that is generated by the power supply circuit 690. The AC gain of the amplifier U3A is generally determined by the ratio of resistor R22 to resistor R25. Using the nominal values shown in FIG. 6, the gain would be about 3.3 at 60 kHz with the gain rolling off at frequencies above 60 kHz to avoid interference by other noise sources. The DC gain of the op amp is approximately unity, since no DC current flows from the output of the op amp, past the inverting input of the op amp, to ground. DC current is substantially blocked by capacitor C14. Therefore, the output of the op amp is an AC signal centered at about 5 VDC. Preferably, op amp U3A is one section of a type TL084 quad op amp package as it is a higher speed device able to handle signals in the 60 kHz region.

The HF pulse detector circuit further includes a variable gain operational amplifier U3B. The output signal from op amp U3A is directly coupled to op amp U3B's non-inverting input. As with op amp U3A, the DC gain of op amp U3B is approximately unity, and the output of op amp U1B is centered at about 5 VDC. The AC gain of op amp U3B is determined primarily by the ratio of feedback resistor R21 to the network of resistors R13, R14, R16, and R17. R13, R14 and R16 are switched in and out of the circuit by microcontroller 670 by software configurable input/output pins RB2, RB3 and RB4, respectively, on the microcontroller 670. When microcontroller 670 configures port pins RB2, RB3 or RB4 as inputs, they have very high effective impedance, effectively removing R13, R14 and R16, respectively, from the AC circuit gain of op amp U3B. When the microcontroller 670 (see FIG. 6D) configures port pins RB2, RB3 or RB4 as outputs, with a logic high output level, then R13, R14 or R16, respectively, are in parallel with R17.

When only R17 is in the circuit, the AC gain of op amp U3B is approximately 1.3. When R13, R14, R16, or any combination thereof, is switched in parallel with R17 the gain increases. Thus, the software within the microcontroller 670 effectively controls the gain of fop amp U3B by switching resistors R13, R14 and R16 in and out. This capability allows the microcontroller 670 to detect HF signals over a wide dynamic range, using only low cost components.

The non-inverting input of a comparator U2A connects to the output of U3B. The inverting input, as well as the output, of comparator U2A connects to an RC filter circuit 614 comprised of resistor R7 and capacitor C3. This RC circuit 614 has a time constant of about 0.5 seconds. In the absence of an HF signal, the non-inverting input of comparator U2A is at 5 volts. The open-collector output of comparator U2A will be turned "off" as long as its non-inverting input is more positive than the inverting input of U2A, allowing resistor R7 to charge capacitor C3 up to 5 volts. When an HF signal is present, HF pulses are amplified by op amps U3A and U3B, causing the output of op amp U3B to oscillate around the DC value of about 5 volts. During the negative portion of the pulses, whenever the instantaneous value of the voltage at the non-inverting input of comparator U2A dips below the voltage stored by capacitor C3 and sensed by the inverting input of comparator U2A, then the output stage of comparator U2A will turn on, tending to discharge capacitor C3. Once capacitor C3 has been sufficiently discharged that its voltage is no longer smaller than the voltage at the non-inverting input of comparator U2A, comparator U2A switches off its output stage. The capacitor C3 discharges quickly because the output of comparator U2A is a saturated transistor to ground, while resistor R7 can only slowly charge capacitor C3 back up to 5 volts. Comparator U2A acts as a negative peak detector and rectifier that can generate output voltage continuously from 5 volts down to 0 volts. (While a discrete signal diode could substitute, there may be a dead band due to the forward voltage drop of the diode (0.7V). Such a dead band would minimize efficacy of the diode in this application.)

Microcontroller port pin RB5 connects through resistor R6 (see FIG. 6A) to the peak detector output. When microcontroller 670 port pin RB5 is set by software as an input, its high impedance has no effect on the peak detector. When port pin RB5 is set to an active-high output, current through resistor R6 rapidly charges capacitor C3 to its maximum voltage of 5 volts. This arrangement allows microcontroller 670 to reset capacitor C3 to 5 volts, which is necessary when switching gain ranges using port pins RB2, RB3, and RB4 as described above. When the gain is increased, then the old peak value at the output of comparator U2A must be erased, so as to capture the new peak value in the new range of signal strengths. The output of comparator U2A is connected to analog input port AN0 of microcontroller 670. In the absence of an HF signal, the microcontroller 670 sees a signal of about 5 volts. The stronger the HF signal, the more that the voltage at AN0 decreases towards 0 volts. The microcontroller 670 measures the relative strength of the HF signal at analog input AN0.

Figure 6B:
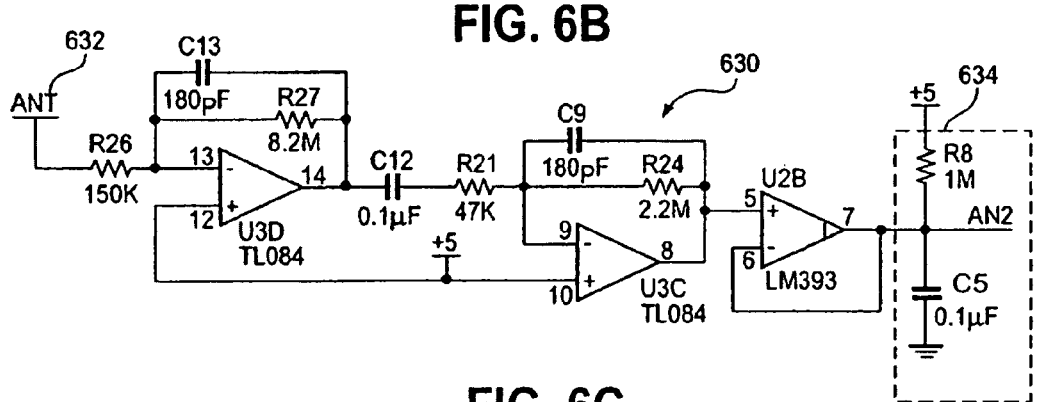

60 Hz signals are detected by the field detector circuit 630 (FIG. 6B). Field detector circuit 630 includes an antenna 632 located at the nose of the receiver. Antenna 632 is preferably a copper foil area on both sides of the receiver's printed circuit board.

The field detector circuit further includes an operational amplifier U3D. The inverting input circuit of op amp U3D is a high impedance circuit, toward facilitating detection of weak AC fields. The non-inverting input of op amp U3D connects to +5V and since the DC gain of U1 is about unity, the DC output level is approximately 5 volts. AC gain based upon the nominal values shown is about 55, as determined by the ratio of resistor R27 to resistor R26. Capacitor C13 is intended to remove high frequency noise.

60 Hz signals are further amplified by operational amplifier U3C. Because of the high gain at op amp U3D, C12 is a DC blocking capacitor that prevents any input offset voltage at op amp U3D to be amplified by U3D's gain and resulting in a shift in the DC output at pin 14 away from the intended 5 volt level.

Negative peak detector comparator U2B connects to the output of U3C. Its output connects to an RC filter circuit 634 (consisting of R8 and C5). The output of comparator U2B is also connected to analog input channel AN2 of the microcontroller 670. In the absence of a 60 Hz input signal, the microcontroller 670 sees a signal of about 5 volts. When a 60 Hz signal is present, resulting signals are amplified by op amps U3D and U3C, causing the output of U3C to oscillate around the DC value of 5 volts. During the negative portions of the pulses, the output stage of comparator U2B conducts, momentarily discharging the RC circuit 634. The stronger the 60 Hz signal, the more that the voltage at AN2 decreases towards 0 volts. The microcontroller 670 measures the strength of the 60 Hz signal at analog input AN2. The field detector circuit may similarly be used to detect 50 Hz signals by altering the component values.

Microcontroller 670 in one embodiment of the invention is a Microchip PIC16C72A microcontroller. Microcontroller 670 preferably contains software.

User perceivable signaling device 650 (FIG. 6D) may be a visual signal, an audible signal, or both. In the present implementation, the visual signal device is an LED L1. LED L1 is preferably a three lead, two color device. Microcontroller port pins RB1 and RB0 may control the green and red segments of L1. Resistors R20 and R18 establish appropriate LED currents when these segments are turned on. A yellow appearance may be generated when both the red and green segments are on simultaneously.

An audible signal device in the present invention is a buzzer BZ1. Buzzer BZ1 provides strong audible indication of the functions of the receiver. In the present implementation, the buzzer BZ1 is a piezoelectric beeper with built-in oscillator. The microcontroller 670 turns it on by asserting a logic high level at port pin PC2, which turns on transistor Q3 through resistor R11, which in turn switches on BZ1.

Figure 6C:
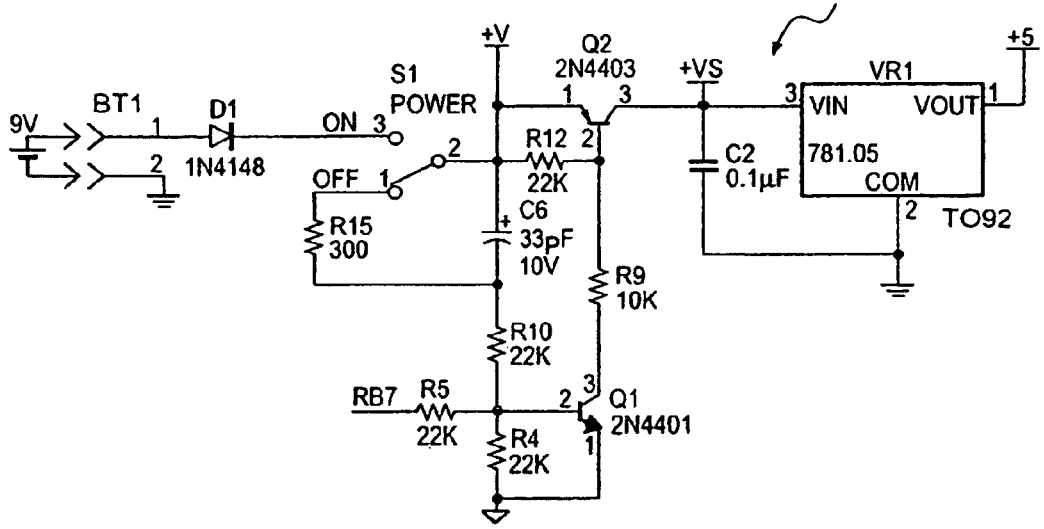
Figure 6D:
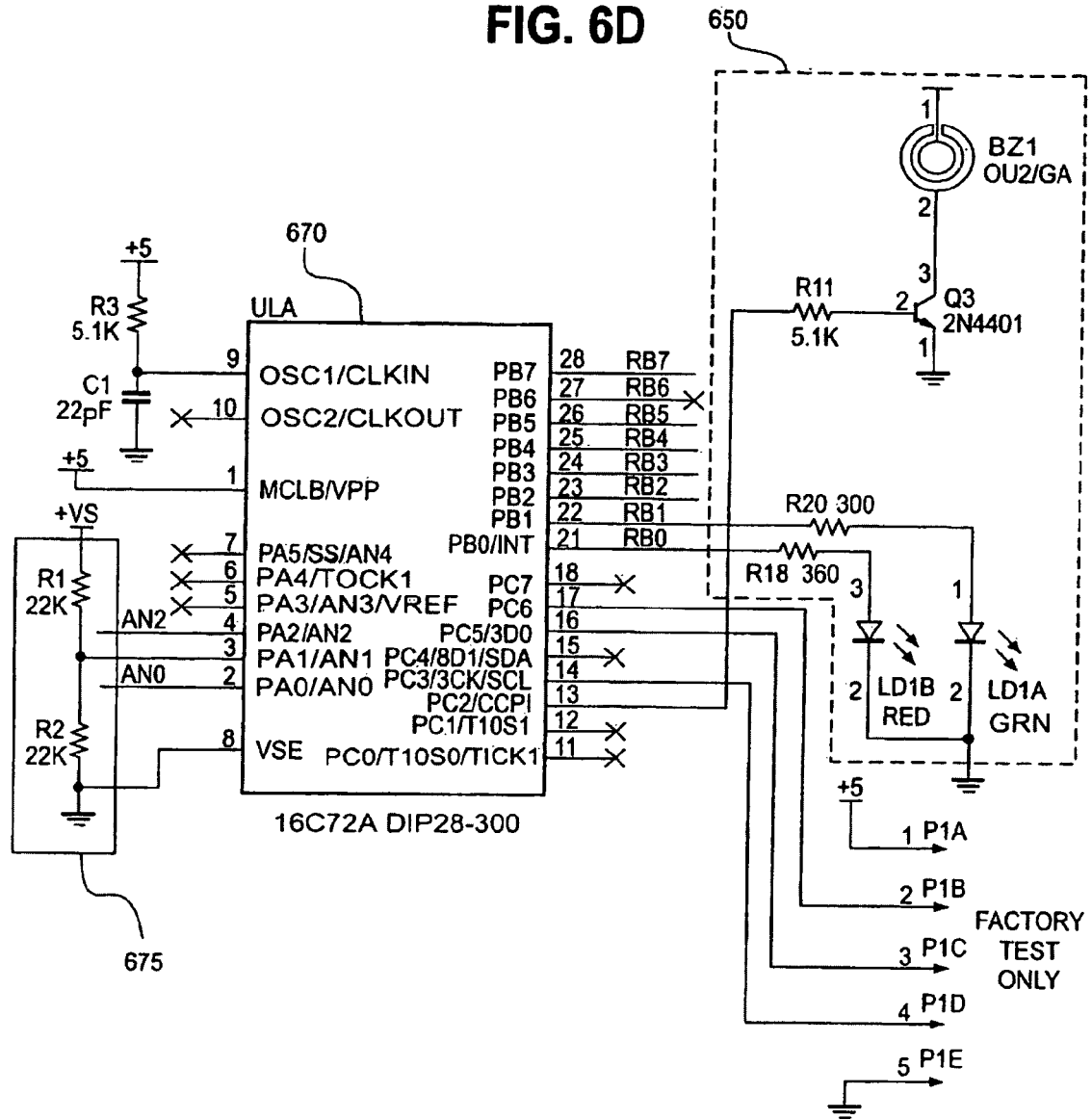

The power supply circuit in the present implementation of the invention is driven by a nine volt battery BT1 (FIG. 6C). Diode D1 serves to protect the electronics against an unintentional reversal of the battery BT1. Though the construction of the battery terminals prevent continued operation with reversed polarity, it is possible for the user to momentarily misconnect the battery clip while trying to insert a new battery.

This invention will be further explained by way of example. The user turns on the receiver 600 by throwing the power switch S1 from the OFF to the ON position. The switch S1 connects the positive terminal of the battery BT1 to the circuit V+. Transistor Q2 also turns on, providing +VS to the op amp positive power rail and to the input terminal of voltage regulator VR1.

Transistor Q2 is preferably a PNP transistor whose base connects to resistor R12, tending to keep Q2 off. Q2 will turn on if transistor Q1 turns on, sinking current through resistor R9. Q1 has a pull-down resistor R4, which tends to keep it turned off. Q1 will turn on if either R5 or R10 is connected to a positive terminal.

When the power switch S1 is first turned on, capacitor C6 is initially discharged. The negative terminal of C6 is also at battery potential. This voltage level causes sufficient current to flow through resistor R10 to turn on Q1, which turns on Q2.

However, C6 gradually charges through R10, and the current through R10 into the base of Q1 diminishes, which causes Q1 to shut off after about one half second. However, shortly after start-up, the microcontroller 670 turns on port pin RB7 in order to lock the power supply on. As long as port pin RB7 is at a high level, current through resistor R5 keeps transistor Q1 on, which keeps transistor Q2 on.

When the receiver 600 has been inactive for a predetermined period of time (no HF or AC signals have been detected), microcontroller 670 may turn off port pin RB7 in order to go to sleep and avoid unnecessary battery drain. Q2 then shuts off, and only a very small leakage current is drained from the battery BT1. To start up again, the user must first shut off S1. This switches resistor R15 across C6, making sure that it is quickly discharged. The user then turns S1 back on and the cycle repeats.

Furthermore, a resistor divider 675 (see FIG. 6D) made up of R1 and R2 measures the battery voltage. The microcontroller software adjusts the input voltage at AN1 for the voltage drop across D1 and Q2. When the potential falls below a preset limit, the microcontroller signals a low-battery condition and shuts the receiver off.

Figure 7:
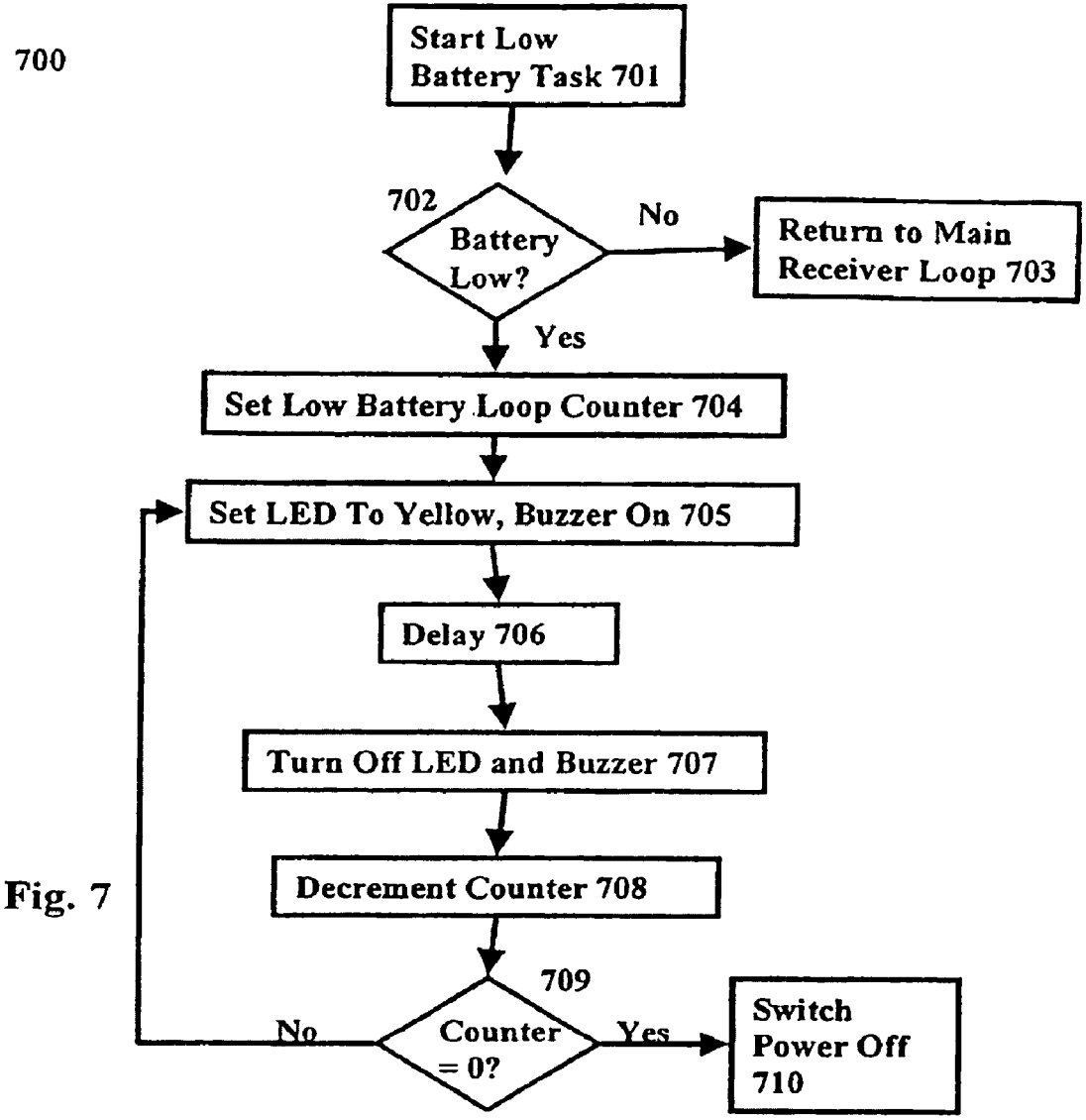
FIG. 7 is a flow chart depicting a low battery task performed by the receiver of FIG. 6.

FIG. 7 is a flow chart of the low battery task program 700 operating. After a start state 701, the battery level is checked in step 702. If it is normal, step 703 returns control of the main receiver loop. If the battery is low, control passes to step 704 that sets a low battery loop counter. In the preferred embodiment, the loop counter is set to 3. In step 705, the LED is switched to a yellow color and the preselected sound pattern that indicates low battery is selected. After a predetermined delay in step 706, the LED and the sound pattern are turned off in step 707. The loop counter is then decremented by 1 in step 708. If the counter is 0, the power is shut off (step 710). If the counter is not 0, the LED is once again switched on and the preselected sound patterns is selected. In the preferred embodiment, steps 705-708 flash the LED and beep the buzzer three times before shutting off the power.

Figure 8:
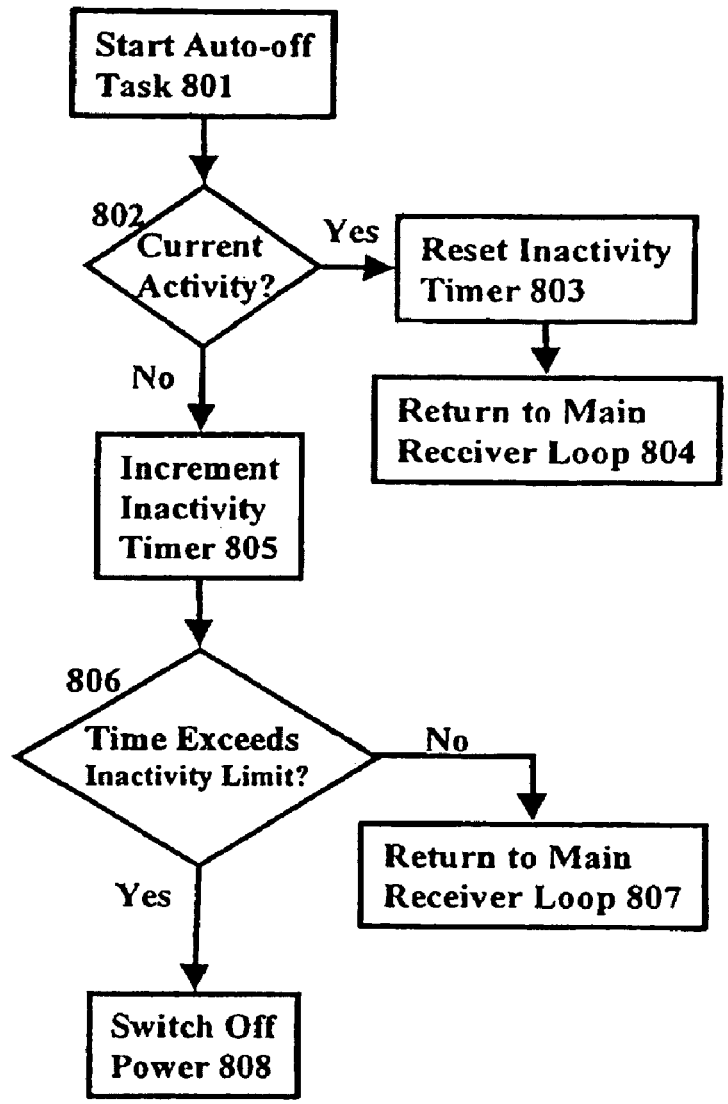
FIG. 8 is a flow chart depicting an AutoOff operation performed by the receiver of FIG. 6.

FIG. 8 is a flow chart of the AutoOff operation, generally depicted as numeral 800. The main receiver software loop periodically invokes the auto-off task 801. In step 802, the software checks whether there is any HF detector or AC detector activity. If there is activity, flow passes to step 803 in which an inactivity timer is reset to 0 and control returns to the main receiver loop (step 804).

If there is no current receiver activity, the inactivity timer is incremented (step 805). Step 806 checks whether the receiver has been inactive for greater than a preset amount of time. In the preferred embodiment, the preset amount of time is 10 seconds. If the receiver has not been inactive for 10 seconds, control is returned to the main receiver loop (step 807). If the inactivity has reached 10 seconds, the power is switched off in step 808.

Figure 9:
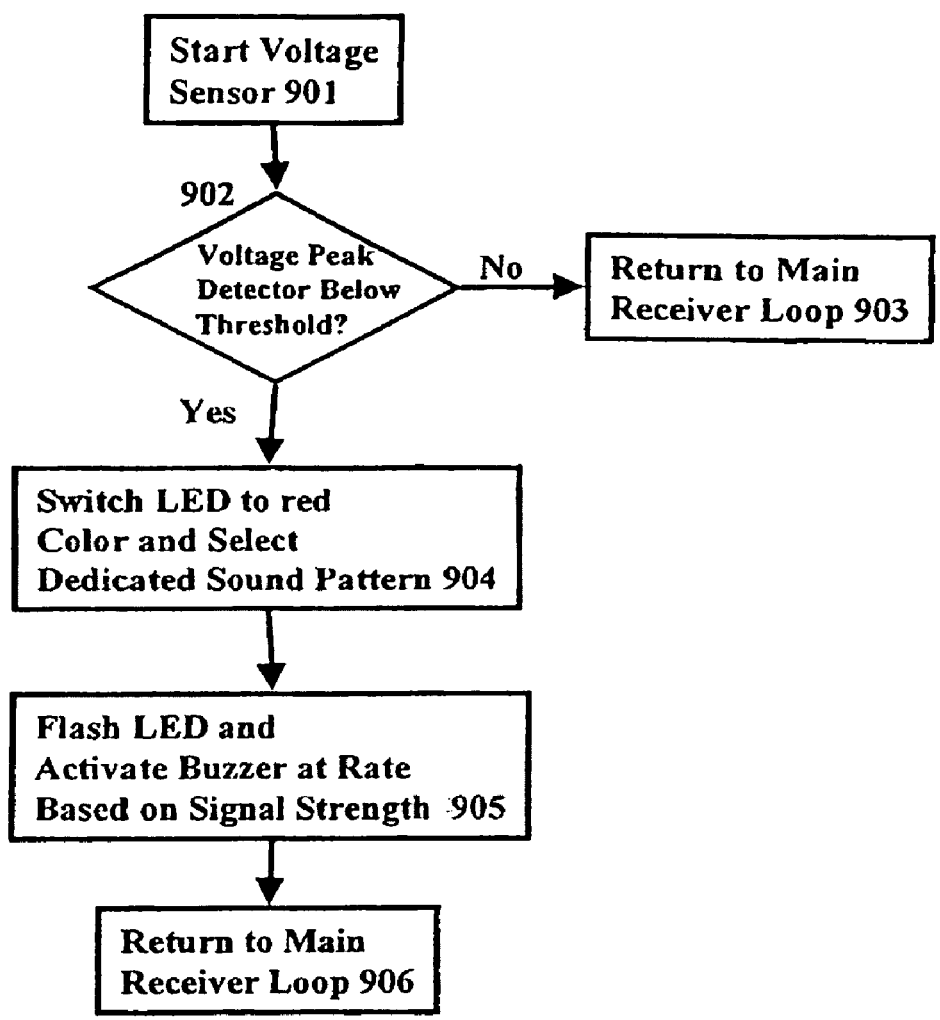
FIG. 9 is a flow chart depicting a voltage sensor operation performed by the receiver of FIG. 6.

The flow chart of FIG. 9 depicts the voltage sensor operation (900). After a start state 901, the software checks the analog input voltage from the AC detector stage 630 (FIG. 6). As previously described with respect to the operation of field detector 630, the voltage at microcontroller 670 analog input AN2 decreases as the 60 Hz field increases. In step 902, this input is compared against a preset threshold, and if the voltage has not fallen below the threshold, control is returned to the main receiver loop in step 903. If, however, a signal is detected, the LED is switched to a red color and the buzzer is turned on (step 904). The LED and buzzer are then flashed and beeped at a speed proportionate to the detected signal strength (step 905)

It should be noted that any receiver capable of picking up a predetermined signal can be used in association with the transmitters disclosed herein.

Figure 10:
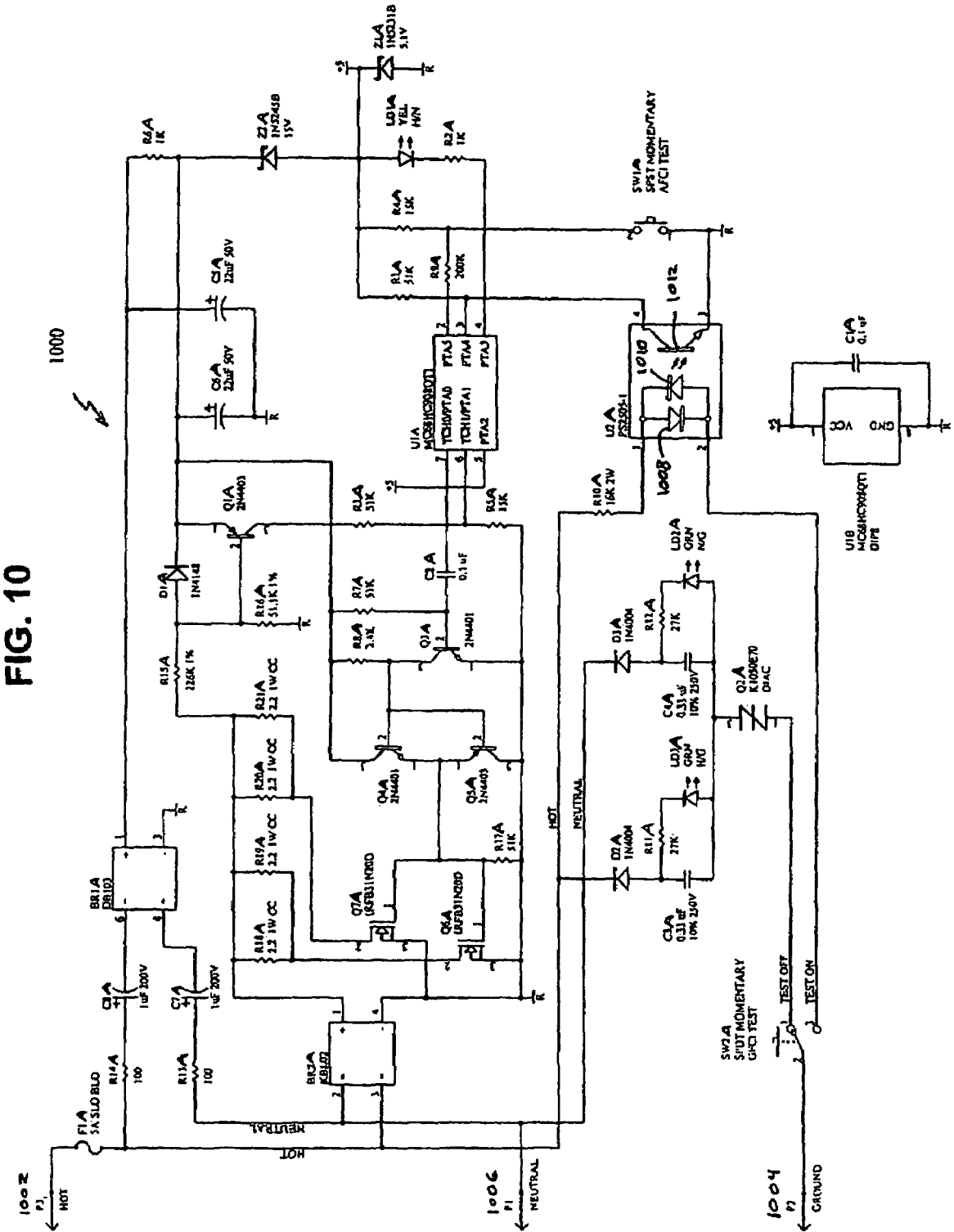
FIG. 10 is a schematic diagram illustrating a fourth potential embodiment of the transmitter of the present invention.

In an embodiment, the transmitter can further provide for testing an arc fault circuit interrupter (AFCI). This transmitter test can be included into a transmitter alone or combined with the other transmitter tests described above. That is, the transmitter can perform one or more of the following tests: AFCI testing, GFCI testing, circuit breaker identification, and receptacle wire testing. FIG. 10 depicts a schematic diagram of an illustrative transmitter 1000 consistent with the present invention that performs all four of the tests. One having skill in the art will appreciate that the circuit depicted in FIG. 10 can be adapted when less than all four tests are implemented in the transmitter.

Transmitter 1000 is preferably a single compact unit having a plastic enclosure. Transmitter 1000 has three prongs P3, P1, and P2 designed to be respectively inserted into the hot, neutral and ground contacts of a 120 VAC receptacle. The transmitter also has three lamps LD1A, LD2A, and LD3A, such as LEDs, which indicate status, and two user-actuatable switches SW1A and SW2A. Switch SW2A effects GFCI testing and switch SW1A effects AFCI testing. The transmitter's circuitry is sealed within the plastic enclosure.

As will be described in more detail below, to operate the transmitter, the user plugs the transmitter into a 120 VAC receptacle. Upon insertion into the receptacle, the lamps indicate whether the circuit is properly wired. When the user actuates switch SW1A to affect AFCI testing, the transmitter generates simulated arc fault pulses on the branch circuit. If the circuit is protected by a properly-working AFCI, the AFCI should trip, which removes power from the receptacle. When the user actuates switch SW2A to affect GFCI testing, the transmitter generates a simulated ground fault pulse on the branch circuit. If the circuit is protected by a properly-working GFCI, the GFCI should trip, removing power from the receptacle.

Further, transmitter 1000 generates pulses on the branch circuit that can be used along with a receiver, such as the receivers described above, to locate a circuit interrupter associated with the receptacle. With transmitter 1000 plugged into the receptacle, the user goes to the circuit breaker panel and scans over the circuit interrupters with the receiver. As described above, audible and visual indicators identify which circuit interrupter feeds the receptacle into which transmitter 1000 has been inserted. This feature can be additionally beneficial, for example, when transmitter 1000 fails to trip an AFCI. The user can trace the branch circuit to the AFCI to diagnose the AFCI.

As will be described in more detail below, transmitter 1000 includes three pulse-generating circuits. One of the pulse-generating circuits is connected between a hot lead 1002 and ground 1004 (a hot-to-ground pulse circuit), the second pulse-generating circuit is connected between a neutral lead 1006 and ground 1004 (a neutral-to-ground pulse circuit), and the third pulse-generating circuit is connected between hot lead 1002 and neutral lead 1006 (a hot-to-neutral pulse circuit).

The hot-to-ground pulse circuit comprises a disc Q2A, a diode D2A, a capacitor C3A, a resistor R11A, and LED LD3A. The neutral-to-ground pulse circuit comprises diac Q2A, a diode D3A, a capacitor C4A, a resistor R12A, and LED LD2A. Thus, diac Q2A is common between the hot-to-ground and neutral-to-ground pulse-generating circuits.

Switch SW2A is, for example, a momentary single-pole double-throw switch whose normally-closed contacts connect diac Q2A to ground 1004. Therefore, a path to ground 1004 exists for the two diac-based pulse generating circuits, unless the user activates switch SW2A to perform a ground fault circuit interrupter test, as discussed further below.

When pulses are generated in the hot-to-neutral pulse circuit, diode D2A is forward-biased during those half-cycles of the 120 VAC waveform in which ground is more positive than hot. Diac Q2A remains in a non-conducting, high-impedance state until the voltage across diac Q2A exceeds its turn-on threshold, which is for example approximately 105 volts DC. At that point, diac Q2A rapidly switches on, and its impedance becomes very low. Capacitor C3A initially has no charge across it, and appears like a short circuit. Accordingly, a large amount of current flows from ground to hot. This current rapidly charges capacitor C3A, causing the voltage across capacitor C3A to rise to the instantaneous line voltage, for example around 105 VDC. As the voltage across capacitor C3A rises, the current flow through the hot-to-neutral pulse circuit decreases, until diac Q2A no longer has sufficient current flowing through it to stay turned on, and therefore shuts off.

Figure 11:
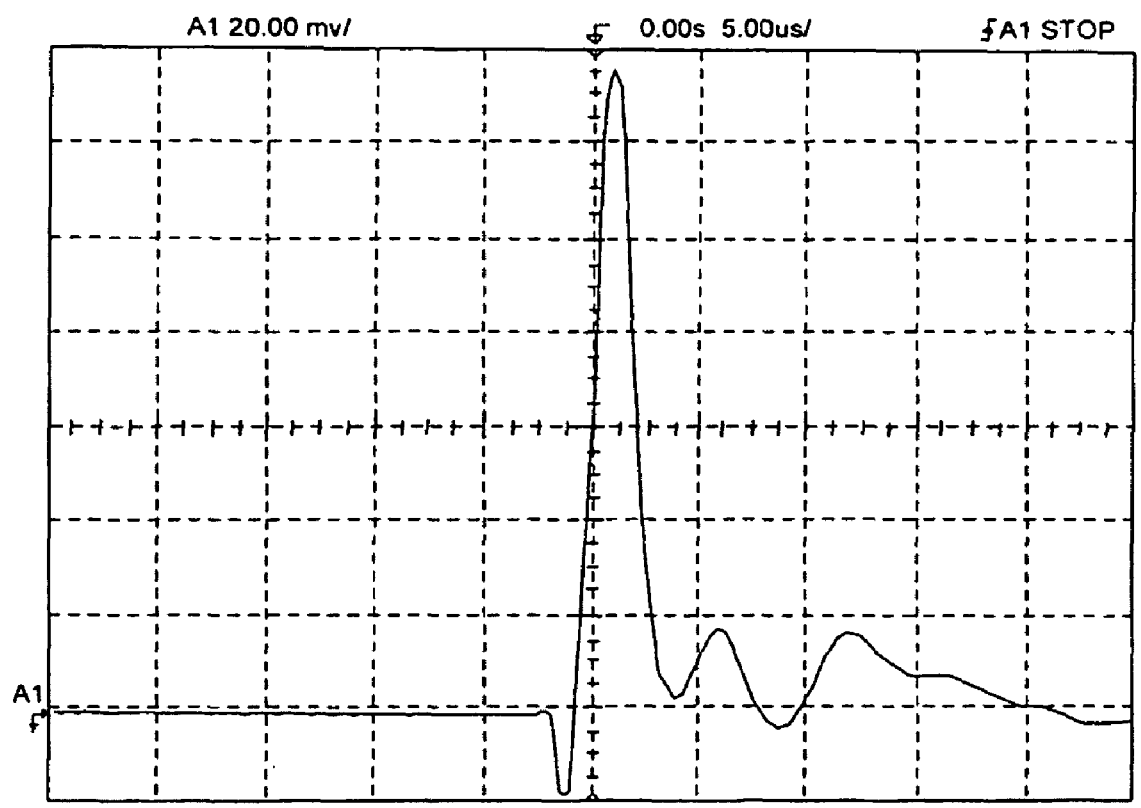
FIG. 11 is an illustrative plot of a current spike signal produced by the transmitter of FIG. 10 for identifying a circuit breaker.

Capacitor C3A has therefore been charged to around 105 VDC. This stored charge circulates through resistor R11A and LED LD3A, lighting LED LD3A. By the time the next positive half-cycle occurs, capacitor C3A has been completely discharged. An illustrative pulse waveform generated via the action of diac Q2A and one of capacitor C3A or C4A, depending on which test is performed, is depicted in FIG. 11. In the illustrative pulse waveform, the pulse has a peak amplitude of around 13 amps and a duration of around 5 microseconds.

The pulse can be used by the receiver to trace which circuit breaker feeds the receptacle into which transmitter 100 is plugged. The neutral-to-ground pulse circuit operates in a similar manner to the hot-to-ground circuit. However, in the neutral-to-ground pulse circuit, LED LD2A lights when there is AC potential between neutral and ground.

As there are three pulse-generating circuits (hot-to-neutral, hot-to-ground, and neutral-to-ground), transmitter 1000 generates circuit breaker identifier pulses when energy is present on any combination of two wires of the hot, neutral, and ground. In other words, pulses are generated if there are both a hot potential and a ground potential (ground or neutral) even if the receptacle is improperly wired. Therefore, a user can identify a circuit breaker even when the receptacle is improperly wired.

Similar to the embodiments described above, LED LD3A, LED LD2A, and LED LD1A serve as wiring indicators to indicate whether the receptacle is properly wired. In a preferred design, LED LD3A is a green light, LED LD2A is a red light, and LED LD1A is a yellow light. The different illumination patterns of LEDs LD3A, LD2A, and LD1A created by the various wiring scenarios is indicated in the following table:

|  | LD3A | LD2A | LD1A |
|---|---|---|---|
| Properly wired circuit | ON | OFF | ON |
| Open ground | ON | OFF | OFF |
| Open neutral | OFF | ON | ON |
| Reversed hot and neutral | ON | ON | OFF |
| Hot on neutral with open neutral | OFF | ON | OFF |
| Unenergized circuit | OFF | OFF | OFF |

The third pulse-generating circuit is connected between hot and neutral and provides two modes of operation: circuit breaker identifier mode and arc fault circuit breaker test mode. The third pulse-generating circuit is controlled by a microcontroller U1A, which comprises a memory and a processing unit. The memory includes a main program and an interrupt program, both of which are run on the processing unit. Preferably, microcontroller U1A may be, for example, a Motorola MC68HC908QT1CP microcontroller unit (MCU). It contains an internal oscillator that runs, for example, at 3.2 MHz±25%, without the need for external frequency-determining circuits, such as a crystal, ceramic resonator, or RC (resistor-capacitor) combination. Microcontroller U1A is connected to a +5V voltage at its Vcc pin 1 and to ground at its pin 8. Pins 1 and 8 are coupled by a capacitor C1A.

A full-wave bridge rectifier BR1A is part of a power supply for the hot-to-neutral pulse circuit. A capacitor C7A and a capacitor C8A, which are connected in series with the respective input leads at pins 4 and 6 of a full-wave bridge rectifier BR2A, serve as non-dissipative voltage-dropping elements. A resistor R13A and a resistor R14A limit inrush current in the event that transmitter 1000 is plugged into a receptacle when the sinusoidal AC line voltage is at a peak voltage value. A capacitor C5A helps filter the AC ripple voltage at the output of full-wave bridge rectifier BR1A.

A zener diode Z1A, which is for example a 5.6-volt zener diode, serves as a voltage regulator and provides microcontroller U1A with an operating voltage of around 5 VDC. Current is entering microcontroller U1A is reduced via resistors R1A, R2A, R4A, and R9A. Zener diode Z1A and a zener diode Z2A together provide a regulated supply of about 20 VDC that is used to provide gate drive to the power FET circuitry, as described in more detail below. A resistor R6A, together with zener diodes Z1A and Z2A and a capacitor C6A, make up a filter that further reduces the AC ripple not removed by capacitor C5A.

Full-wave bridge rectifier BR2A is a high-power unit whose AC input terminals are connected to hot 1002 and neutral 1006. In the illustrative example, the rectified voltage at its positive output terminal is a full-wave rectified waveform with a peak voltage of about 170 volts for a 120 VAC line voltage input. That is, the peak rectified voltage=120 VAC× √2=169.7 VAC peak.

During operation, the signal at microcontroller U1A pin 6 is a square wave whose rising edge occurs after the AC line voltage waveform has reached its peak, and is now falling. That is, the voltage is at around 115 VDC. Microcontroller U1A uses this signal to synchronize with the incoming AC line voltage waveform. To generate the timing signal at pin 6, an emitter of a PNP transistor Q1A is connected to the 20 VDC power supply. The base of transistor Q1A is connected to a voltage divider made up of a resistor R15A and a resistor R16A. This voltage divider is fed from the positive output terminal 1 of full-wave bridge rectifier BR2A. When the instantaneous voltage at the positive output terminal of full-wave bridge rectifier BR2A falls below about 115 VDC, transistor Q1A's base voltage falls below transistor Q1A's emitter voltage, and transistor Q1A turns on. The resulting current through a resistor R3A and a transistor R5A cause a high voltage level of about 4.5 VDC to appear at microcontroller U1A pin 6.

Microcontroller U1A normally holds the voltage at its port pin 7 at a logic high level of 5 VDC. To generate a current pulse from hot to neutral, microcontroller U1A momentarily outputs a logic low level at its pin 7. This low-level pulse is coupled through a capacitor C2A to the base of an NPN transistor Q3A. Transistor Q3A is normally biased into the ON condition by pull-up a resistor R7A on its base lead. When the pulse from microcontroller U1A pin 7 arrives, transistor Q3A turns off and stops sinking current through pull-up a resistor R8A, which is coupled to the collector of transistor Q3A. The voltage at the junction of resistor R8A and transistor Q3A's collector goes high to 20 VDC. This voltage is coupled to the base of an NPN transistor Q4A, which therefore turns on. The voltage at the emitter of transistor Q4A goes high, which in turn provides voltage to the gates of a power FETs Q6A and a power FET Q7A. Power FETs Q6A and Q7A accordingly turn on, drawing current through a resistor R18A, a resistor R19A, a resistor R20A, and a resistor R21A. The resulting low-resistance path between hot and neutral generates a substantial current pulse.

The two power FETs Q6A and Q7A are utilized in the illustrative circuit to reduce the cost of the circuit. The two power FETs could alternatively be replaced a single FET with lower on-resistance, however, that would typically increase the cost of the circuit.

Capacitor C2A and resistor R7A form an RC circuit with a time constant of approximately 5 milliseconds (that is 51 KΩ×0.1 µf). The RC circuit effects limiting the maximum effective pulse width. Microcontroller U1A generates pulses with a duration of about 10 microseconds in circuit breaker identifier mode, and about 1 millisecond in arc fault circuit breaker tester mode. If normal operation of microcontroller U1A is disrupted by noise or there is some other microcontroller U1A fault condition, and microcontroller U1A pin 7 stays low for longer than the intended pulse width, after about 2.2 milliseconds resistor R7A will charge up capacitor C2A (even though microcontroller U1A pin 7 is still low) to the point that transistor Q3A will turn on again, thereby ending the pulse. Capacitor C2A and resistor R7A therefore make up a watchdog timer that helps protect against destruction of power FETs Q6A and Q7A by thermal overload, in the event of microcontroller U1A's control failure. Pull down resistor R17A connects the bases of power FETs Q6A and Q7A to reference voltage.

Transistor Q4A and a PNP transistor Q5A make up a push-pull driver circuit for the base of power FETs Q6A and Q7A, which each require a higher gate voltage than can be provided directly by microcontroller U1A. The collector of transistor Q4A is fed by 20 VDC as regulated by zener diodes Z2A and Z1A. When transistor Q3A turns off, at the start of a pulse, resistor R8A pulls high, turning on transistor Q4A. When transistor Q3A turns on, at the end of a pulse, transistor Q4A turns off. Because of the capacitance at the gates of power FETs Q6A and Q7A, these devices tend to turn off slowly. Transistor Q5A is therefore preferably in the circuit to assure faster turn-off of power FETs Q6A and Q7A. When transistor Q4A turns off, there may still be residual voltage at the gates of power FETs Q6A and Q7A, but transistor Q5A turns on, thus rapidly discharging the base capacitance at the gates of power FETs Q6A and Q7A. Transistor Q5A turns on in this condition because its emitter is high, while its base is low. The rapid turn-off characteristic of power FETs Q6A and Q7A is important for precise control of power FETs Q6A and Q7A pulse widths, and also to limit power dissipation by power FETs Q6A and Q7A during the transition by power FETs Q6A and Q7A from fully on to fully off.

A slow transition can result in significant switching losses while the parts are in linear mode, that is, not Fully on and not fully off.

The four pulse load resistors R18A, R19A, R20A, and R21A are preferably carbon composition resistors, which allows them to withstand repetitive surge duty. In contrast, wire-wound or metal film devices have relatively poor capability to withstand high peak surge currents. In the illustrative example, four two-watt pulse load resistors provide the required energy capability. Resistors R18A and R19A are controlled by power FET Q6A, while resistors R20A and R21A are controlled by power FET Q7A, which helps to balance current flow between power FETs Q6A and Q7A. In the illustrative example, power FETs Q6A and Q7A are type IRFBA90N20B, which has an on-resistance of approximately 82 milliohms. The combined resistance of resistors R18A, R19A, R20A, and R21A is about 0.55 ohms (i.e., 2.2Ω÷4).

When the transmitter is in circuit breaker identifier mode, microcontroller U1A generates short pulses at its pin 7 that last 10 microseconds. These pulses are similar in duration and amplitude to the pulses generated by the two diac-based pulse-generating circuits discussed above. The pulses allow the receiver to trace the circuit interrupter which powers the receptacle into which transmitter 1000 is installed.

When the user pushes an arc fault test switch SW1A on transmitter 1000, microcontroller U1A changes to AFCI test mode. In AFCI test mode, microcontroller U1A generates a burst of 10 short pulses, once each 60-Hz half-cycle, with each pulse being about 1 millisecond in duration. If transmitter 1000 is plugged into a circuit, powered by an AFCI, these pulses should cause the AFCI to trip. Accordingly, power to the receptacle will be interrupted, and transmitter 1000 will turn off. The LEDs LD3A, LD2A, and LD1A will turn off, providing a visual indication to the user that the AFCI has tripped.

If however power continues to be available after the test switch SW1A has been depressed, the microcontroller U1A flashes LED LD1A on and off repeatedly, for a 10-second period, as a signal to the user that the AFCI test did not reset the AFCI. During this 10-second time period, preferably microcontroller U1A locks out the test switch SW1 to avoid overheating the power FETs Q6A and Q7A and the load resistors R18A-R21A. New arc fault pulses cannot be generated during this lockout period.

When power continues to be available after the test switch SW1A is depressed, microcontroller U1A reverts its pulse-generating functionality to circuit interrupter identifier mode. That is, it generates 10-microsecond pulses when required.

In a preferred embodiment, microcontroller U1A derives its timing from an internal oscillator, which in the illustrative example operates at a frequency of 3.2 MHz±25%. This confers added noise immunity to microcontroller U1A, because external microcontroller oscillator circuitry is typically noise sensitive. However, the resulting internal clock frequency is generally not as precisely controlled as when an external crystal or ceramic resonator are provided. As described below with reference to FIGS. 12-14, Microcontroller U1A automatically calibrates itself when power is first applied by measuring its internal timers against the repetitive synchronization signal at microcontroller U1A pin 6. After a number of pulses are measured, microcontroller U1A's firmware calculates its internal clock rate, and uses that calibrated value to generate precise timing periods for generating pulses and time-outs.

The pulses generated by the transmitter are regulated in two ways. First, the synchronization signal at microcontroller U1A pin 6 is generated at a constant voltage point in the AC waveform, whether the line voltage is at a nominal level of 120 VAC, or is lower or higher than the typical line voltage with a range from 108 to 132 VAC (i.e., 120 VAC±10%). Second, the pulse duration is regulated by microcontroller U1A's self-calibrated timing algorithm.

In addition to testing AFCI receptacles, the transmitter can also test the functionality of GFCI receptacles. When the user actuates switch SW2A, a power resistor R10A is coupled between hot and ground. This generates a ground fault current in the branch circuit. If the transmitter is plugged into a circuit powered by a GFCI, this ground fault current should cause the circuit interrupter to trip. Power to the receptacle will be interrupted, and the transmitter will turn off. LEDs LD3A, LD2A, and LD1A turn off, providing a visual indication to the user that the circuit interrupter has tripped.

An optical coupler U2A senses when the user is performing the GFCI test. Back-to-back LED diodes 1008 and 1010 within optical coupler U2A are connected in series with ground fault resistor R10A. During the GFCI test, a phototransistor 1012 within optical coupler U2A turns on and off at a 120 Hz rate, in response to each 60 Hz half-cycle. A collector of phototransistor 1012 at optical coupler U2A pin 4 shorts microcontroller U1A's input at microcontroller U1A pin 3 to a low voltage level, which microcontroller U1A uses to detect that a GFCI test is in progress.

If power continues to be available after switch SW2A has been depressed, microcontroller U1A flashes LED LD1A on and off repeatedly, for a 10-second period, as a signal to the user that the GFCI test did not reset the circuit interrupter.

A fuse F1A is desirable to protect the circuitry within transmitter 100. This fuse is preferably UL-rated, for example, for surge currents well in excess of 120 amperes and may be a slow-blow 5-ampere fuse. During normal operation, the average current usage of transmitter 1000 is well below 5 amperes. In the event of a failure of the control circuitry that turns on the power FETs Q6A and Q7A, such that the power FETs Q6A and Q7A are turned on for longer than the intended time periods described above, or in the event of a failure of either power FET Q6A or Q7A, then fuse F1A will open and remove power from transmitter 1000.

Figure 12:
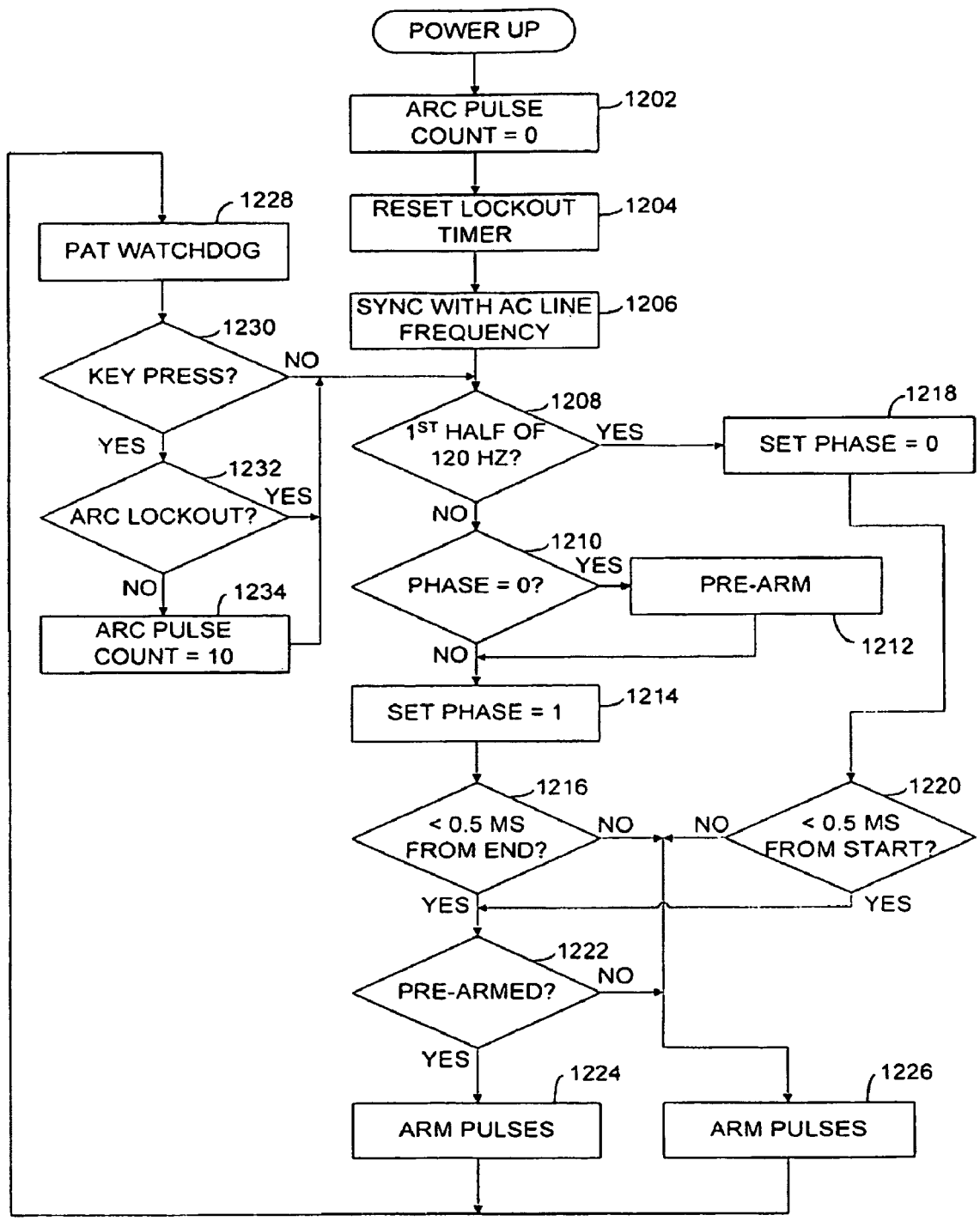
FIG. 12 is a flow chart depicting the illustrative steps performed by the main program in the transmitter of FIG. 10.

FIG. 12 is flow diagram illustrating the exemplary steps performed by the main program that is in the memory of microcontroller U1A. Microcontroller U1A starts execution of the main program at power-up, and runs the program until power is removed. A timer within microcontroller U1A runs continuously at a rate of approximately 400 kHz and causes an internal counter to increment for each tick of the timer. The main program examines the current timer count and compares that count to a previous count to determine how much time has elapsed. Using this information, the main program determines when to fire arc fault pulses or circuit breaker identifier pulses.

The main program changes operating modes based on the current time with respect to the 120 Hz AC line frequency. It also prepares to fire arc fault pulses when the user presses switch SW1A. Arc fault pulses and circuit breaker identifier pulses are generated under control of the interrupt program, which runs when microcontroller U1A receives a synchronization pulse as described below.

Microcontroller U1A has an internal watchdog timer implemented in its hardware. The main program triggers the watchdog timer regularly as it continues in a main loop on a continual basis. If however a hardware or software fault disrupts periodic triggering of the watchdog timer, the watchdog timer times out, microcontroller U1A resets itself, and the main program restarts execution from its beginning. Therefore, the watchdog timer is used as a safeguard to prevent runaway operation of microcontroller U1A.

The main program executes a two-level pulse-arming scheme as an additional safeguard against generation of pulses at an incorrect time period with respect to the AC line frequency. Each time the main program executes, it calculates whether it is an appropriate time for a pulse to be generated. As described below with reference to FIG. 12, the main program first determines whether the current time is in the first or second half of the interval between AC line synchronization pulses. When the current time transitions from the first half, to the second half, of the 120 Hz interval, the main program performs pre-arming of the pulse to generate the next pulse. Since pre-arming happens once per AC line synchronization interval, the main program assures that no more than one output pulse is generated per 120 Hz interval. The main program then determines whether the current time is within 0.5 milliseconds before or after the next expected AC line synchronization pulse. If the current time is within the last half of the 120 Hz interval, then the current time should be within the 0.5 milliseconds before the next expected AC line synchronization pulse. If the current time is in the first half of the 120 Hz interval, then the current time should be within 0.5 milliseconds after the expected AC line synchronization pulse. If the current time is within this window, and the pulse is pre-armed, then the main program arms the pulse to generate the pulse at the next synchronization interrupt.

Referring to FIG. 12, first, the main program sets the arc pulse count equal to zero (step 1202). Then, the main program resets a lockout timer (step 1204) and synchronizes the current time with the 120 Hz AC line frequency (step 1206). If the current time is not in the first half of the 120 Hz AC line frequency (step 1208), then the main program determines whether the phase is equal to zero (step 1210). If the phase is equal to zero in step 1210, then the main program pre-arms the pulse (step 1212). If the phase is not equal to zero in step 1210 or after the pulse is pre-armed in step 1212, then the main program sets the phase equal to 1 (step 1214).

Then, the main program determines whether the current time is less than 0.5 milliseconds from the end of the expected AC line synchronization pulse (step 1216).

If the main program determines in step 1208 that the current time is in the first half of the 120 Hz AC line frequency, then the main program sets the phase equal to zero (step 1218). After the phase is set to zero in step 1218, the main program determines whether the current time is less than 0.5 milliseconds from the beginning of the expected AC line synchronization pulse (step 1220).

If the current time is less than 0.5 millisecond from the end of the expected AC line synchronization pulse in step 1216 or the currently time is less than 0.5 milliseconds from the beginning of the expected AC line synchronization pulse in step 1220, then the main program determines whether the pulse is pre-armed (step 1222). If the pulse is pre-armed, then the main program arms the pulses (step 1224).

However, if the current time is not less than 0.5 millisecond from the end of the expected AC line synchronization pulse in step 1216 or the currently time is not less than 0.5 milliseconds from the beginning of the expected AC line synchronization pulse in step 1220 or the pulse is not pre-armed in step 1222, then the main program disarms the pulse (step 1226).

After the main program arms the pulse in step 1224 or disarms the pulse in step 1226, then the main program pats the watchdog timer (step 1228). If it is then determined that switch SW1A is pressed (step 1230), then the main program determines whether the arc lockout timer is still counting to lock out the arc pulse (step 1232). If the arc pulse is not locked out, then the main program sets the arc pulse count equal to 10 (step 1234). However, if switch SW1A is not pressed in step 1230 or the arc pulse is locked out in step 1232 or after the arc pulse count is set in step 1234, then the main program execution returns to step 1208.

Microcontroller U1A is programmed such that the rising edge of the synchronization signal on microcontroller U1A pin 6 causes a hardware interrupt. At that time, the main program is immediately suspended and control passes to the interrupt program. This immediate processing assures low-latency processing of timing signals, which improves timing accuracy.

Figure 13:
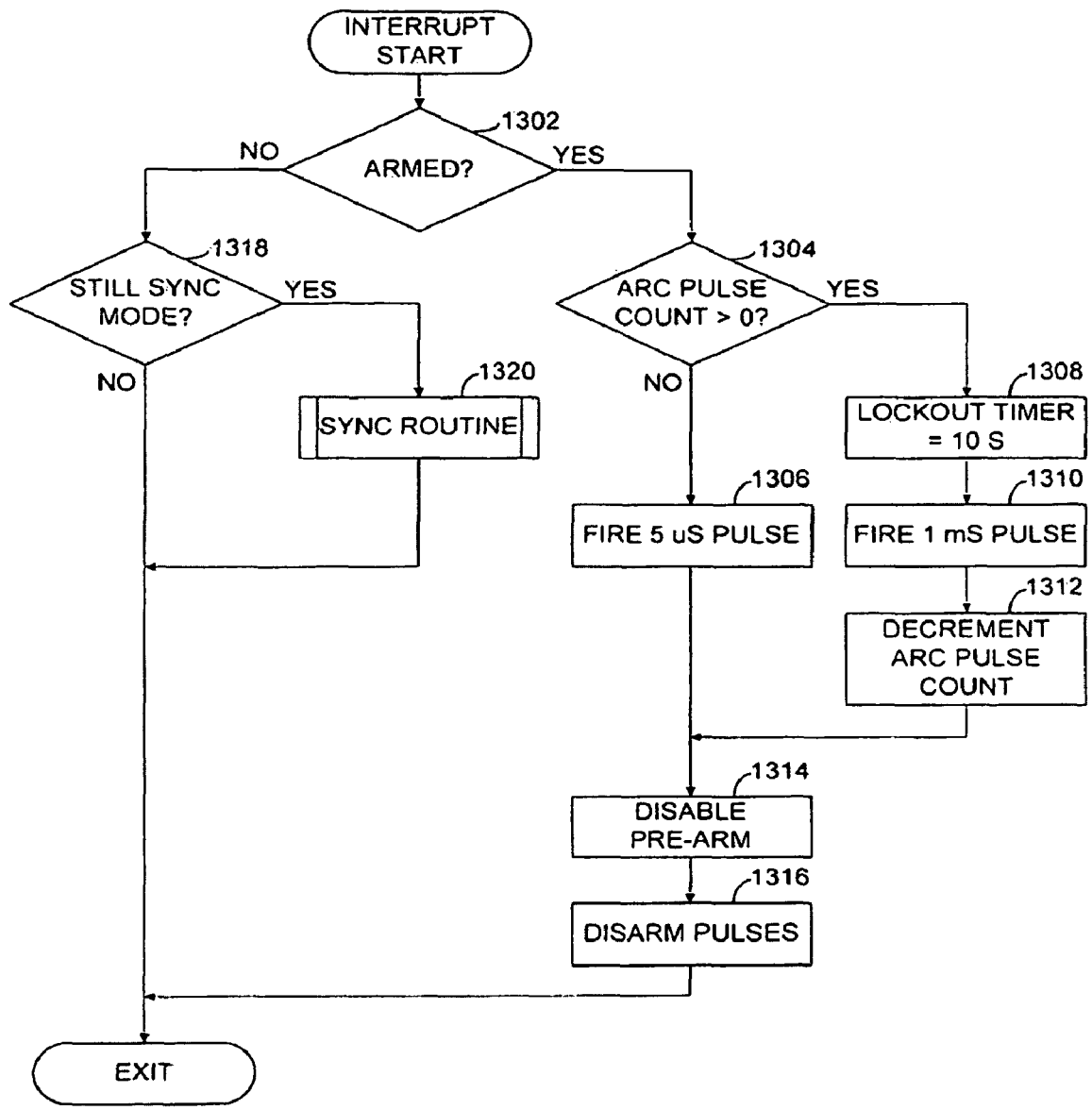
FIG. 13 is a flow chart depicting the illustrative steps performed by the interrupt program in the transmitter of FIG. 10.

FIG. 13 depicts a flow diagram illustrating the exemplary steps performed by the interrupt program. Based on flags set by the main program, the interrupt program decides what tasks to perform, if any; performs the task; and then exits and waits for the next synchronization pulse. In FIG. 13, first, the interrupt program determines whether the pulse is armed (step 1302). If the pulse is armed in step 1302, then the interrupt program determines whether the arc pulse count is greater than zero (step 1304). If the arc pulse count is not greater than zero, then the interrupt program effects firing of a 5 microsecond pulse (step 1306).

However, if the arc fault pulse count is greater than zero, then the interrupt program sets the lockout timer equal to 10 seconds (step 1308). Then, the interrupt program effects firing of a 1 millisecond pulse (step 1310) and decreases the arc fault count by 1 (step 1312). After the firing of a pulse in step 1306 or the decrease of the arc fault count in step 1312, the interrupt program disables the pre-arm (step 1314) and disarms the pulses (step 1316) and then exits.

If the interrupt program determines in step 1302 that the pulse is not armed, then the interrupt program determines whether it is still in synchronization mode (step 1318). If the interrupt program is not still in synchronization mode, then the interrupt program exits. However, if it is still in synchronization mode, then it executes a synchronization routine (step 1320), which is described in more detail below with reference to FIG. 14.

When power is first applied to the transmitter, microcontroller U1A synchronizes its internal timer with the AC line frequency. The synchronization routine runs for the first 64 synchronization pulses received at power-up. Since synchronization pulses are generated at 120 Hz for a 60 Hz AC line frequency, the synchronization takes a little over 0.5 seconds. After that time, normal operation of the transmitter proceeds.

The synchronization subroutine comprises an algorithm for filtering the interval between synchronization pulses. When the first synchronization pulse is received, the timer value is simply recorded. When the second synchronization pulse is received, the first interval (i.e., the number of timer ticks between the first and second synchronization pulses) is calculated, and this calculated value is used to prime a digital filter algorithm. For the third through sixty-forth synchronization pulses, each new interval value is calculated and filtered using the digital filter. The formula for performing this calculation is shown in the equation below:

$$\text{new calc value} = \tfrac{3}{4} \times (\text{old calc value}) + \tfrac{1}{4} \times (\text{new value}).$$

This filter generates an average time interval between synchronization pulses, which helps to reduce time inaccuracies caused by noise on the AC line. As an additional approach to reject noise pulses, the timer interval for the thirteenth through sixty-forth synchronization pulses must be at least 75% of the filtered interval to be accepted. Shorter intervals are rejected as noise pulses.

Figure 14:
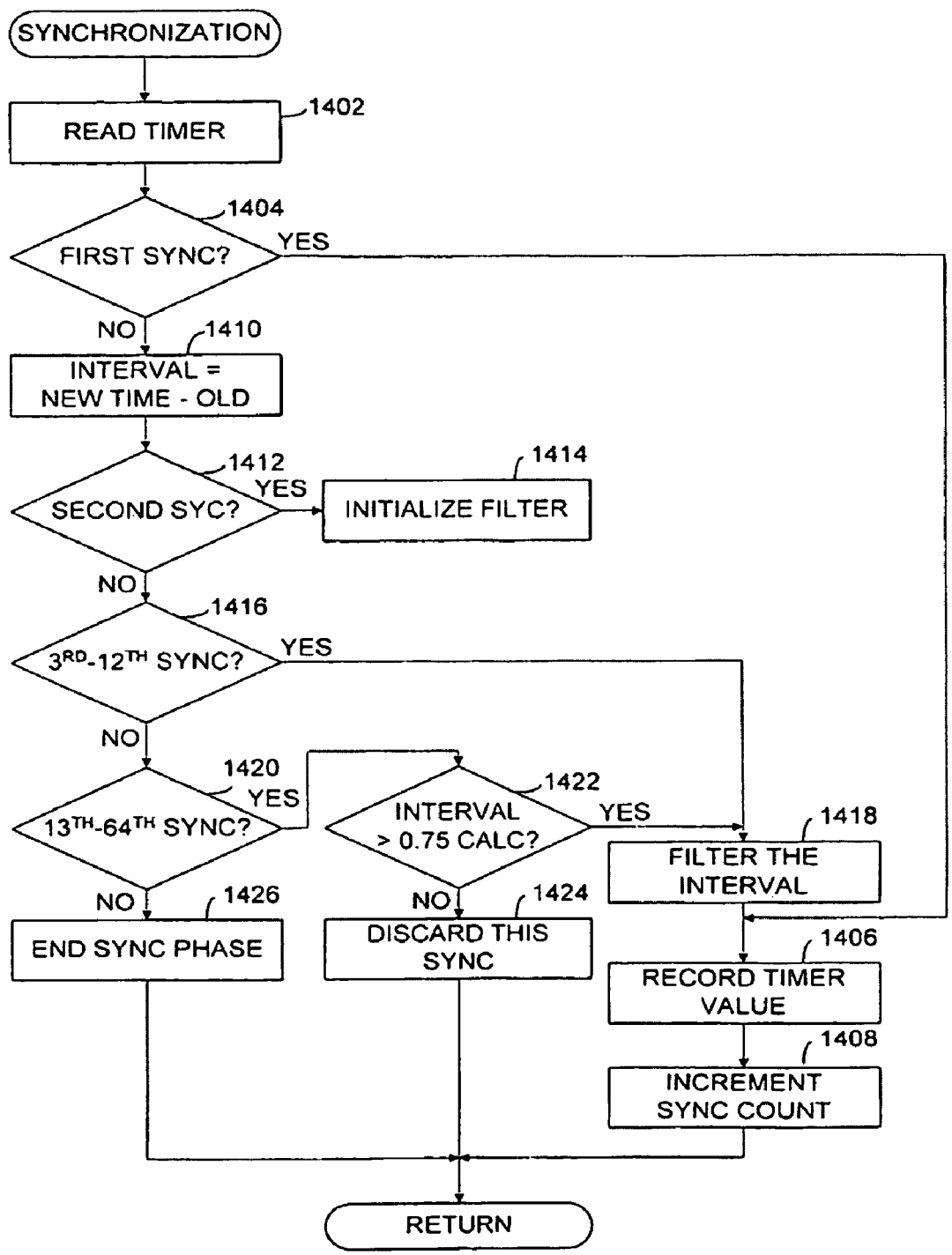
FIG. 14 is a flow chart depicting the illustrative steps performed by the synchronization subroutine in the transmitter of FIG. 10.

Referring to FIG. 14, first, the synchronization subroutine of the interrupt program reads the timer (step 1402). If the timer indicates that the first synchronization pulse has been received, in step 1404, then the synchronization routine records the timer value (step 1406) and increments the synchronization count by 1 (step 1408).

If the timer indicates that synchronization pulse is not the first synchronization pulse in step 1404, then the synchronization routine sets the interval to the new time minus the old time (step 1410). Then, in step 1412, if the synchronization pulse is the second synchronization pulse, the synchronization routine initializes the filter (step 1414) and execution continues to step 1406.

If, in step 1412, the synchronization pulse is not the second synchronization pulse, then the synchronization routine determines whether the synchronization pulse is the third through twelfth synchronization pulse (step 1416). If the synchronization pulse is the one of the third through the twelfth, then the synchronization routine filters the interval (step 1418) and execution continues to step 1406.

If the synchronization pulse is not one of the third through twelfth in step 1416, then the synchronization routine determines whether the synchronization pulse is one of the thirteenth through sixty-forth synchronization pulses (step 1420). If the synchronization pulse is one of the thirteenth through sixty-forth synchronization pulses in step 1420, then the synchronization program determines whether the interval is greater than 75% of the filtered interval (step 1422). If the interval is greater than 75% of the filtered interval, then execution continues to step 1418, otherwise the interval is discarded (step 1424).

If the synchronization pulse is not one of the thirteenth through sixty-forth synchronization pulses in step 1420, then the synchronization program ends the synchronization phase (step 1426) and exits the subroutine.

Figure 15:
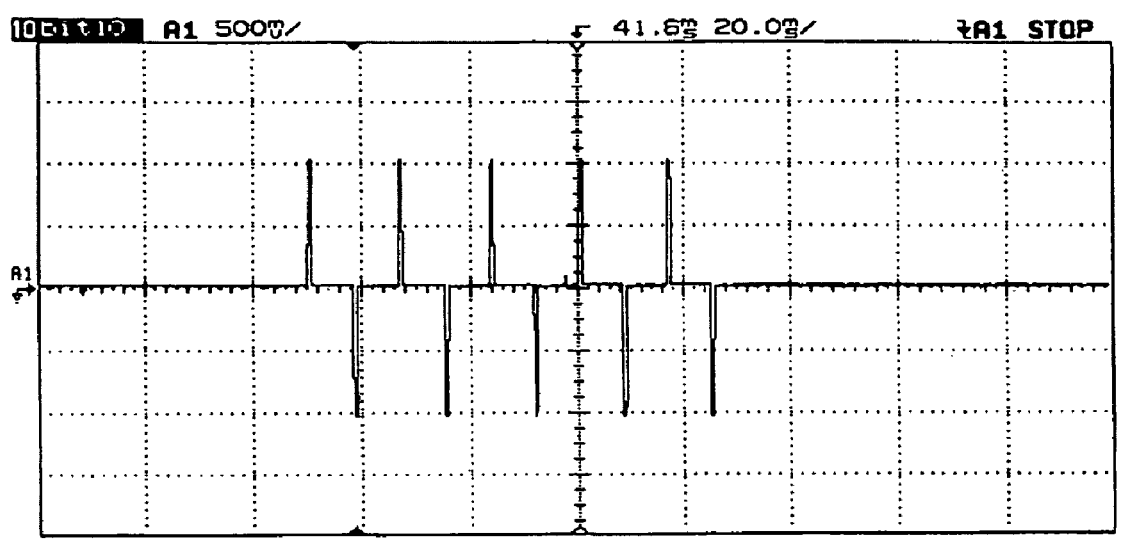
FIG. 15 is an illustrative plot of an arc fault signal produced by the transmitter of FIG. 10 for testing an AFCI.

FIG. 15 depicts an illustrative waveform of the arc fault pulses generated by the transmitter when the user presses switch SW1A. As shown, there are 10 pulses with alternating polarity. The pulses are spaced 8.3 milliseconds apart, occurring during alternating positive and negative phases of the 60 Hz AC line voltage. To obtain the data for FIG. 15, a current probe was clamped around the hot conductor leading into the receptacle into which the transmitter was plugged. The current probe generates a voltage output of 10 mV per ampere, and that voltage output was inputted into an oscilloscope. The absolute values of the measured peak voltages were just above 1.0 volt, which reflects peak currents of just over 100 amperes. If an AFCI was connected to the circuit, it most likely would have tripped before all 10 arc fault pulses were generated.

The foregoing description and drawings merely explain and illustrate the invention and the invention is not limited thereto. Those of the skill in the art who have the disclosure before them will be able to make modifications and variations therein without departing from the scope of the present invention.

We claim:

1. A testing system comprising:

a hand-held transmitter that plugs into a receptacle electrically coupled to a selected branch circuit, the transmitter having a circuit effective to test an arc fault circuit interrupter electrically coupled to the selected branch circuit by creating a first pulse on the branch circuit that is effective to trip the arc fault circuit interrupter, wherein the transmitter performs a test of determining a location of a circuit interrupting device electrically coupled to the selected branch circuit by creating a second pulse on the branch circuit to be sensed by a receiver located proximately to the respective circuit interrupting device and broadly tuned about a frequency of the second pulse.

2. The testing system of claim 1, wherein at least a portion of a circuit for performing the test of determining the location of the circuit interrupting device is common to the circuit effective to test the arc fault circuit interrupter.

3. The testing system of claim 1, wherein the first pulse has a higher current than the second pulse.

* * * * *